US011875720B2

(12) United States Patent
Lee et al.

(10) Patent No.: US 11,875,720 B2
(45) Date of Patent: Jan. 16, 2024

(54) DISPLAY DEVICE

(71) Applicant: Samsung Display Co., LTD., Yongin-si (KR)

(72) Inventors: Gwang Teak Lee, Yongin-si (KR); Tae Gon Im, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/093,031

(22) Filed: Jan. 4, 2023

(65) Prior Publication Data

US 2023/0215326 A1 Jul. 6, 2023

(30) Foreign Application Priority Data

Jan. 5, 2022 (KR) .................. 10-2022-0001762

(51) Int. Cl.
*G09G 3/32* (2016.01)
*G09G 3/20* (2006.01)
(Continued)

(52) U.S. Cl.
CPC ............. *G09G 3/2007* (2013.01); *G09G 3/32* (2013.01); *G09G 3/3233* (2013.01);
(Continued)

(58) Field of Classification Search
CPC ...... G09G 3/2007; G09G 3/32; G09G 3/3233; G09G 2300/0423; G09G 2300/0814;
(Continued)

(56) References Cited

U.S. PATENT DOCUMENTS 9,053,664 B2   6/2015  Lee
11,158,266 B2  10/2021 Baek et al.
(Continued)

FOREIGN PATENT DOCUMENTS

JP     2020-183998    11/2020
KR  10-2013-0055257    5/2013
(Continued)

OTHER PUBLICATIONS

International Search Report with English Translation for International Application No. PCT/KR2023/000041, dated Mar. 31, 2023.

*Primary Examiner* — Sanghyuk Park
(74) *Attorney, Agent, or Firm* — KILE PARK REED & HOUTTEMAN PLLC

(57) ABSTRACT

A display device includes a display panel and the display panel includes a pixel. The pixel includes a light emitting unit including at least one light emitting element, a driving transistor providing a driving current corresponding to a data signal to the light emitting unit, and a first transistor electrically connected between both ends of the light emitting unit. A driver provides the data signal to the pixel and provides a duty control signal to the first transistor. The driver varies a voltage level of the data signal in a first grayscale section in which a grayscale corresponding to the data signal is greater than or equal to a reference grayscale, and varies a duty ratio of the duty control signal in a second grayscale section in which the grayscale is less than the reference grayscale.

20 Claims, 15 Drawing Sheets

(51) Int. Cl.
  *H01L 25/16* (2023.01)
  *G09G 3/3233* (2016.01)
  *H01L 33/32* (2010.01)

(52) U.S. Cl.
  CPC ... *H01L 25/167* (2013.01); *G09G 2300/0426* (2013.01); *G09G 2300/0814* (2013.01); *G09G 2300/0842* (2013.01); *G09G 2320/0626* (2013.01); *H01L 33/325* (2013.01)

(58) Field of Classification Search
  CPC .... G09G 2300/0842; G09G 2320/0626; H01L 25/167; H01L 33/325
  See application file for complete search history.

(56) References Cited

U.S. PATENT DOCUMENTS

| | | | |
|---|---|---|---|
| 11,189,233 B2 | 11/2021 | Son et al. | |
| 2010/0103202 A1* | 4/2010 | Seo | G09G 3/3426 345/87 |
| 2013/0127923 A1* | 5/2013 | An | G09G 3/3233 345/690 |
| 2015/0097764 A1* | 4/2015 | Pyo | G09G 3/3233 345/77 |
| 2022/0189393 A1* | 6/2022 | Kim | G09G 3/3233 |
| 2022/0208066 A1 | 6/2022 | Kikuchi et al. | |

FOREIGN PATENT DOCUMENTS

| | | |
|---|---|---|
| KR | 10-1510885 | 4/2015 |
| KR | 10-2019-0122056 | 10/2019 |
| KR | 10-2019-0138718 | 12/2019 |
| KR | 10-2020-0088696 | 7/2020 |
| KR | 10-2021-0004007 | 1/2021 |

\* cited by examiner

DISPLAY DEVICE

CROSS-REFERENCE TO RELATED APPLICATION(S)

This application claims priority to and benefits of Korean Patent Application No. 10-2022-0001762 under 35 U.S.C. § 119, filed on Jan. 5, 2022 in the Korean Intellectual Property Office, the entire contents of which are incorporated herein by reference.

BACKGROUND

1. Technical Field

An embodiment relates to a display device.

2. Description of the Related Art

In recent years, interest in information displays is increasing. Accordingly, research and development on display devices is continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a display device that displays an image having improved display quality.

Objects of the disclosure are not limited to the object described above, and other objects will be clearly understood by those skilled in the art from the following description.

According to embodiments, a display device may include a display panel including a pixel which may include a light emitting unit including at least one light emitting element; a driving transistor providing a driving current corresponding to a data signal to the light emitting unit; and a first transistor electrically connected between both ends of the light emitting unit; and a driver that provides the data signal to the pixel and provides a duty control signal to the first transistor. The driver varies a voltage level of the data signal in a first grayscale section in which a grayscale corresponding to the data signal is greater than or equal to a reference grayscale, and varies a duty ratio of the duty control signal in a second grayscale section in which the grayscale is less than the reference grayscale.

In an embodiment, an on-duty ratio of the duty control signal may increase as the grayscale decreases in the second grayscale section.

In an embodiment, the voltage level of the data signal may be constant in the second grayscale section.

In an embodiment, the at least one light emitting element may be an inorganic light emitting diode.

In an embodiment, a light efficiency of the light emitting unit may decrease as the driving current of the driving transistor decreases, and the data signal may have a voltage level at which the light efficiency becomes maximum in the second grayscale section.

In an embodiment, the voltage level of the data signal may be substantially discontinuous at a boundary between the first grayscale section and the second grayscale section.

In an embodiment, the driver may include a control block that outputs a first signal having a voltage level corresponding to the grayscale; and a comparator that outputs the duty control signal by comparing a second signal with the first signal, and the duty control signal may be provided to a gate electrode of the first transistor.

The second signal may be a sawtooth wave, a triangle wave, or a sine wave, and the duty control signal may have a turn-on voltage level in case that the second signal is greater than the first signal.

In an embodiment, the first transistor may be an N-type transistor, and a voltage level of the control signal may decrease as the grayscale decreases.

In an embodiment, the pixel may include a sensing transistor electrically connected to a source electrode of the driving transistor, and the driver may receive a sensing signal from the pixel through the sensing transistor.

In an embodiment, the driver may correct a voltage level of the first signal based on the sensing signal.

In an embodiment, the driver may vary the duty ratio of the duty control signal by a pulse frequency modulation.

In an embodiment, the driver may vary each of the voltage level of the data signal and the duty ratio of the duty control signal in a third grayscale section between the first grayscale section and the second grayscale section.

In an embodiment, the voltage level of the data signal may be substantially continuous at a boundary between the first grayscale section and the third grayscale section.

In an embodiment, a first voltage range of the data signal for the first grayscale section and a second voltage range of the data signal for the third grayscale section may not overlap each other in a plan view, and the data signal may have a voltage level at a boundary between the first voltage range and the second voltage range in the second grayscale section.

According to embodiments of the disclosure, a display device may include a driver that generates a duty control signal and a data signal; and a display panel including a pixel emitting light of a luminance corresponding to a duty of the duty control signal and the data signal. Grayscales corresponding to the data signal may be sequentially divided into a first grayscale section, a second grayscale section, and a third grayscale section, the driver may vary a voltage level of the data signal in the first grayscale section and the second grayscale section and may vary the duty of the duty control signal in the third grayscale section, and the voltage level of the data signal in the third grayscale section may be different from the voltage level of the data signal in the second grayscale section, and may be included in a voltage range of the data signal in the first grayscale section.

In an embodiment, the voltage level of the data signal may be constant in the third grayscale section.

In an embodiment, the pixel may include an inorganic light emitting diode, and the data signal may have a voltage level at which a light efficiency of the pixel becomes maximum in the third grayscale section.

According to embodiments, a display device may include a display panel including a pixel emitting light with a luminance corresponding to a duty of a duty control signal and a data signal; and a driver that generates the duty control signal and the data signal and receives a sensing signal from the pixel. The driver may vary a voltage level of the data signal in a first grayscale section in which a grayscale corresponding to the data signal is greater than or equal to a reference grayscale, and may vary a duty ratio of the duty control signal in a second grayscale section in which the grayscale is less than the reference grayscale, and the driver may correct the duty ratio of the duty control signal based on the sensing signal.

In an embodiment, the driver may include a control block that outputs a first signal having a voltage level corresponding to the grayscale; and a comparator that outputs the duty control signal by comparing a second signal with the first signal, and the driver may correct a voltage level of the first signal based on the sensing signal.

Details of other embodiments are included in the detailed description and drawings.

The display device according to embodiments of the disclosure may express a grayscale (or a luminance) by varying an emission duty (or an emission time) of the pixel while maintaining light efficiency of light emitting elements in a low grayscale section in which the light efficiency of the light emitting elements in the pixel is less than a reference efficiency. Since the light efficiency of the light emitting elements is uniformly maintained in a relatively high state also in the low grayscale section, a stain phenomenon caused by low light efficiency (and a light efficiency related characteristic deviation) of the light emitting elements may be removed from an image, and display quality of the display device may be improved.

An effect according to embodiments is not limited by the contents and embodiments above, and more various effects are included in the specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1A:
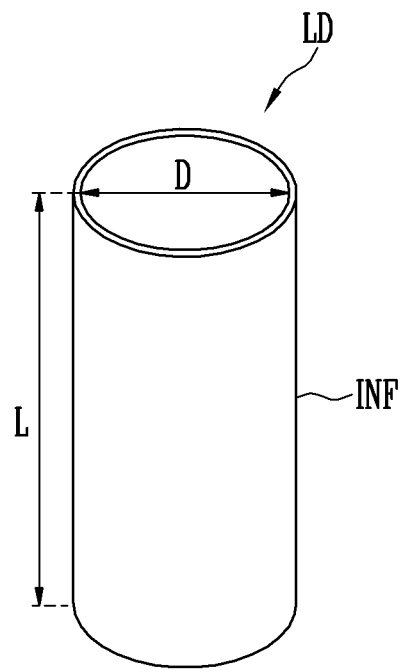
FIG. 1A is a schematic perspective view schematically illustrating a light emitting element according to an embodiment.

The disclosure may be modified in various ways and may have various forms, and embodiments will be illustrated in the drawings and described in detail herein. In the following description, the singular forms also include the plural forms unless the context clearly includes the singular. For example, as used herein, the singular forms, "a," "an," and "the" are intended to include the plural forms as well, unless the context clearly indicates otherwise.

Embodiments are described in the accompanying drawings in relation to a functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. Each block, unit, and/or module may be implemented by dedicated hardware, or a combination of dedicated hardware that performs some functions and a processor (for example, one or more programmed microprocessors and related circuits) that performs a function different from those of the dedicated hardware. In some embodiments, the block, unit, and/or module may be physically separated into two or more individual blocks, units, and/or modules without departing from the scope of the disclosure. In some embodiments, the block, unit and/or module may be physically combined into more complex blocks, units, and/or modules without departing from the scope of the disclosure.

The disclosure is not limited to the embodiments disclosed below, and may be modified and implemented in various forms. Each of the embodiments disclosed below may be implemented alone or in combination with at least one of other embodiments.

In the drawings, some components which are not directly related to a characteristic of the disclosure may be omitted to clearly represent the disclosure. Some components in the drawings may be shown with a slightly exaggerated, size, ratio, or the like within the spirit and the scope of the disclosure. Throughout the drawings, the same or similar components will be given by the same reference numerals and symbols as much as possible even though they are shown in different drawings, and repetitive descriptions may be omitted.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
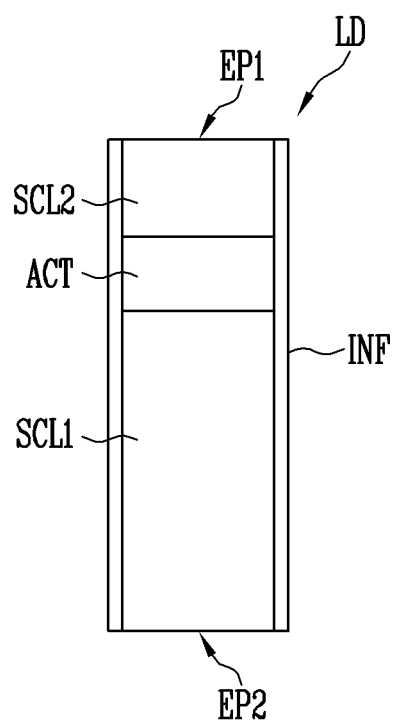
FIG. 1B is a schematic cross-sectional view of the light emitting element of FIG. 1A.

FIG. 1A is a schematic perspective view schematically illustrating a light emitting element according to an embodiment. FIG. 1B is a schematic cross-sectional view of the light emitting element of FIG. 1A. In an embodiment, a type and/or a shape of the light emitting element are/is not limited to the embodiment shown in FIGS. 1A and 1B. It is to be understood that the shapes disclosed herein may include shapes substantial to the shapes disclosed herein.

Referring to FIGS. 1A and 1B, the light emitting element LD may include a first semiconductor layer SCL1 and a second semiconductor layer SCL2, and an active layer ACT interposed between the first and second semiconductor layers SCL1 and SCL2. For example, the light emitting element LD may include the first semiconductor layer SCL1, the active layer ACT, and the second semiconductor layer SCL2 sequentially stacked along a length L direction.

The light emitting element LD may be provided in a rod shape extending along one direction or a direction. In case that an extension direction of the light emitting element LD is the length L direction, the light emitting element LD may have a first end EP1 and a second end EP2 along the length L direction.

Any one of the first and second semiconductor layers SCL1 and SCL2 may be disposed on the first end EP1 of the light emitting element LD. The other one of the first and second semiconductor layers SCL1 and SCL2 may be disposed on the second end EP2 of the light emitting element LD. For example, the second semiconductor layer SCL2 may be disposed on the first end EP1 of the light emitting element LD, and the first semiconductor layer SCL1 may be disposed on the second end EP2 of the light emitting element LD.

According to an embodiment, the light emitting element LD may be a rod-shaped light emitting element (also referred to as a "rod-shaped light emitting diode") manufactured in a rod shape through an etching method or the like within the spirit and the scope of the disclosure. In the specification, the term "rod-shaped" encompasses a rod-like shape or a bar-like shape that is long (for example, having an aspect ratio greater than 1) in the length L direction, such as a circular column or a polygonal column, and a shape of a cross section thereof is not particularly limited. For example, a length L of the light emitting element LD may be greater than a diameter D (or a width of the cross section) thereof.

The light emitting element LD may have a size as small as a nano scale to a micro scale. For example, the light emitting element LD may have each of the diameter D (or width) and/or the length L of a nano scale to micro scale range. However, a size of the light emitting element LD is not limited thereto in the disclosure. For example, the length L of the light emitting element LD may be about 1 μm to about 10 μm, about 3 μm to about 5 μm, or about 3.5 μm to about 4 µm, and the diameter D of the light emitting element LD may be about 10 nm to about 1 µm, about 100 nm to about 800 nm, or about 500 nm to about 600 nm. For example, the size of the light emitting element LD may be changed according to a design condition of various devices using the light emitting element LD as a light source, for example, a display device.

The first semiconductor layer SCL1 may be a semiconductor layer of a first conductivity type. For example, the first semiconductor layer SCL1 may include an N-type semiconductor layer. For example, the first semiconductor layer SCL1 may include any one semiconductor material of InAlGaN, GaN, AlGaN, InGaN, AlN, and InN, and may include an N-type semiconductor layer doped with a first conductivity type dopant such as Si, Ge, or Sn. The first semiconductor layer SCL1 may be formed of various materials in addition to the above-described materials.

The active layer ACT may be disposed on the first semiconductor layer SCL1 and may be formed in a single-quantum well or multi-quantum well structure. A position of the active layer ACT may be variously changed according to the type of the light emitting element LD. The active layer ACT may emit light having a wavelength of 400 nm to 900 nm, and may use a double hetero-structure.

A clad layer (not shown) doped with a conductive dopant may be formed on and/or under or below the active layer ACT. For example, the clad layer may be formed of an AlGaN layer or an InAlGaN layer. According to an embodiment, a material of AlGaN, AlInGaN, or the like may be used to form the active layer ACT, and the active layer ACT may be formed of various materials in addition to the above-described materials.

The second semiconductor layer SCL2 may be disposed on the active layer ACT and may include a semiconductor layer of a type different from that of the first semiconductor layer SCL1. For example, the second semiconductor layer SCL2 may include a P-type semiconductor layer. For example, the second semiconductor layer SCL2 may include at least one semiconductor material among InAlGaN, GaN, AlGaN, InGaN, AlN, and InN, and may include a P-type semiconductor layer doped with a second conductivity type dopant such as Mg. The second semiconductor layer SCL2 may be formed of various materials in addition to the above-described materials.

In an embodiment, the first semiconductor layer SCL1 and the second semiconductor layer SCL2 may have different lengths (or thicknesses) on the length L direction of the light emitting element LD. For example, the first semiconductor layer SCL1 may have a length (or a thickness) longer (or thicker) than that of the second semiconductor layer SCL2 along the length L direction of the light emitting element LD. Accordingly, the active layer ACT of the light emitting element LD may be positioned closer to the first end EP1 than the second end EP2.

In case that a voltage equal to or greater than a threshold voltage is applied to both ends of the light emitting element LD, the light emitting element LD emits light while electron-hole pairs are combined in the active layer ACT. By controlling light emission of the light emitting element LD using such a principle, the light emitting element LD may be used as a light source of various light emitting devices including a pixel of a display device.

In an embodiment, the light emitting element LD may further include an additional component in addition to the first semiconductor layer SCL1, the active layer ACT, and the second semiconductor layer SCL2. For example, the light emitting element LD may additionally include one or more phosphor layers, active layers, semiconductor layers, and/or electrode layers disposed on one end side or an end side of the first semiconductor layer SCL1, the active layer ACT, and/or the second semiconductor layer SCL2.

For example, the light emitting element LD may further include an electrode layer disposed on one end side or an end side of the second semiconductor layer SCL2. The electrode layer may be positioned on the first end EP1 of the light emitting element LD.

The light emitting element LD may further include another electrode layer disposed on one end side or an end side of the first semiconductor layer SCL1. For example, electrode layers may be disposed on the first and second ends EP1 and EP2 of the light emitting element LD.

The electrode layers may be ohmic contact electrodes, but are not limited thereto. For example, the electrode layers may be Schottky contact electrodes.

The electrode layers may include metal or conductive oxide. For example, the electrode layers may be formed of chromium (Cr), titanium (Ti), aluminum (Al), gold (Au), nickel (Ni), oxide or alloy thereof, ITO, or the like alone or in combination. The materials included in each of the electrode layers may be identical to or different from each other.

The electrode layers may be substantially transparent or translucent. Accordingly, light generated in the light emitting element LD may pass through the electrode layers and may be emitted to the outside of the light emitting element LD. In an embodiment, in case that the light generated in the light emitting element LD does not pass through the electrode layers and is emitted to the outside of the light emitting element LD through an area excluding the both ends of the light emitting element LD, the electrode layers may be opaque.

In an embodiment, the light emitting element LD may further include an insulating film INF provided on a surface. The insulating film INF may be formed on the surface of the light emitting element LD so as to surround at least an outer circumferential surface of the active layer ACT, and may further surround one area or an area of the first and second semiconductor layers SCL1 and SCL2.

In case that the light emitting element LD may include the electrode layers, the insulating film INF may at least partially surround an outer circumferential surface of the electrode layers, or may not surround the outer circumferential surface of the electrode layers. For example, the insulating film INF may be selectively formed on a surface of the electrode layers.

The insulating film INF may expose the both ends of the light emitting element LD on the length L direction of the light emitting element LD. For example, the insulating film INF may expose at least one of the first and second semiconductor layers SCL1 and SCL2 and the electrode layers at the first and second ends EP1 and EP2 of the light emitting element LD. By way of example, in an embodiment, the insulating film INF may not be provided in the light emitting element LD.

In case that the insulating film INF is provided to cover or overlap the surface of the light emitting element LD, for example, the outer circumferential surface of the active layer ACT, the active layer ACT may be prevented from being short-circuited with at least one electrode (for example, an alignment electrode and/or pixel electrode which will be described later) or the like which is not shown. Accordingly, electrical stability of the light emitting element LD may be secured.

The insulating film INF may include a transparent insulating material. For example, the insulating film INF may include at least one insulating material of SiO$_2$ or silicon oxide (SiO$_x$) which is not determined thereto, Si$_3$N$_4$ or silicon nitride (SiN$_x$) which is not determined thereto, Al$_2$O$_3$ or aluminum oxide (Al$_x$O$_y$) which is not determined thereto, and TiO2 or titanium oxide (TiOx) which is not determined thereto, but is not limited thereto. For example, a configuration material of the insulating film INF is not particularly limited.

In case that the insulating film INF is provided on the surface of the light emitting element LD, a surface defect of the light emitting element LD may be minimized, and thus life and efficiency may be improved. In case that the insulating film INF is formed on each light emitting element LD, even though light emitting elements LD are disposed close to each other, occurrence of an unwanted short circuit between the light emitting elements LD may be prevented.

In an embodiment of the disclosure, the light emitting element LD may be manufactured through a surface treatment. For example, the surface treatment may be performed on each light emitting element LD so that in case that light emitting elements LD are mixed in a fluid solution (or solvent) and supplied to each emission area (for example, an emission area of each pixel), the light emitting elements LD may be uniformly dispersed in the solution without being un-uniformly aggregated. As a non-limiting embodiment regarding this, the insulating film INF itself may be formed as a hydrophobic film using a hydrophobic material, or a hydrophobic film formed of a hydrophobic material may be additionally formed on the insulating film INF.

The insulating film INF may be a single layer or multiple layers. For example, the insulating film INF may be formed of a double layers.

The insulating film INF may be partially etched in at least one area or an area, for example, at least one of an upper area and a lower area. The insulating film INF may have a rounded shape in the at least one area or an area, but is not limited thereto.

For example, in at least one of the upper area and the lower area of the insulating film INF, the insulating film INF may be partially or entirely removed. Accordingly, at least one of the first semiconductor layer SCL1, the second semiconductor layer SCL2, and the electrode layers may be partially exposed.

The light emitting element LD may be used in various types of devices that require a light source, including a display device. For example, light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

Figure 2:
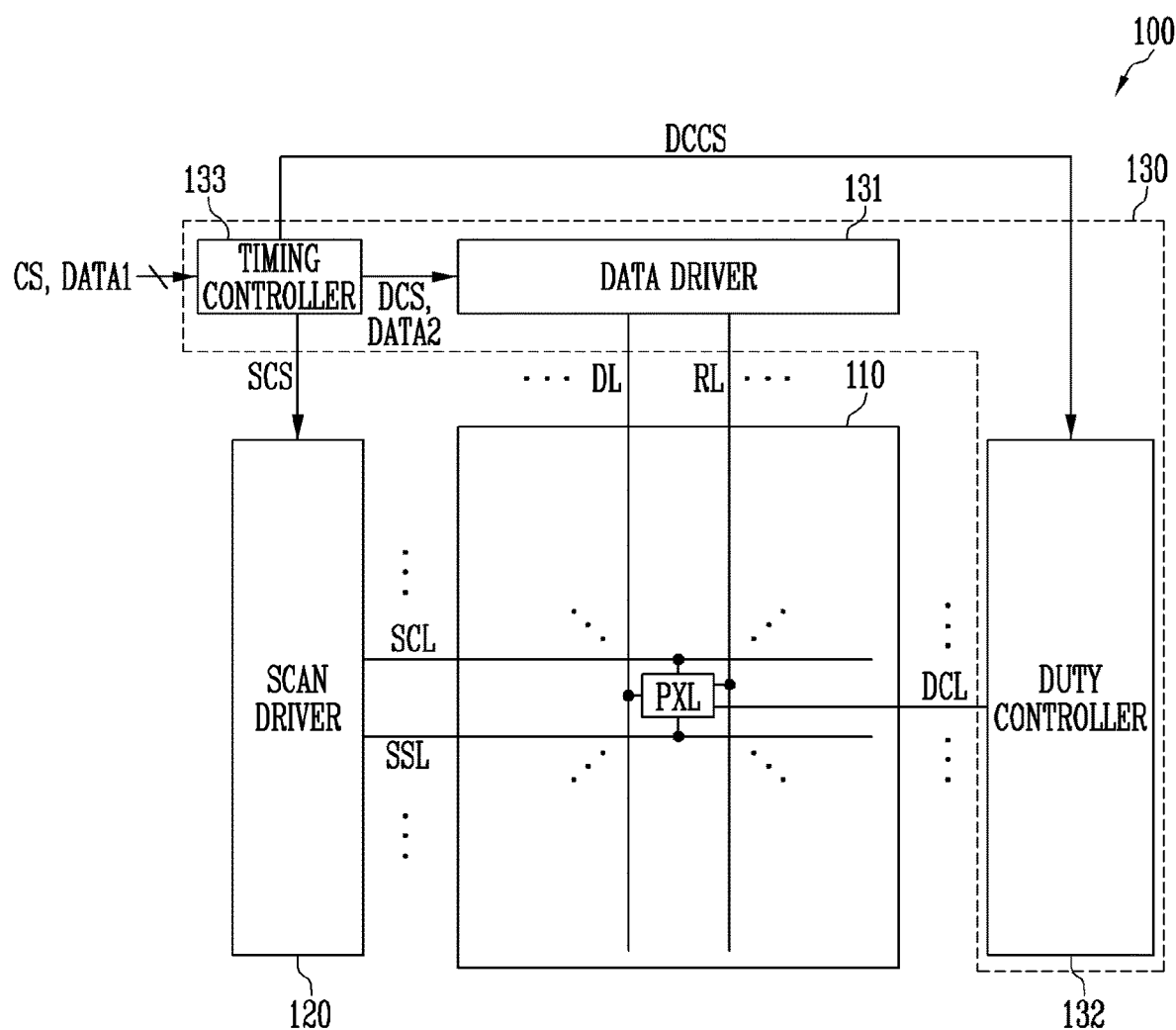
FIG. 2 is a schematic diagram illustrating a display device according to embodiments.

FIG. 2 is a schematic diagram illustrating a display device according to embodiments.

Referring to FIG. 2, the display device 100 may include a display unit 110 (or a display panel), a scan driver 120 (or a gate driver), and a driver 130. The driver 130 may include a data driver 131 (or a source driver), a duty controller 132, and a timing controller 133.

The display unit 110 may display an image. The display unit 110 may include a scan line SCL, a sensing scan line SSL, a data line DL, a readout line RL (or a sensing line), a duty control line DCL (or an emission control line), and a pixel PXL. Each of the scan line SCL, the sensing scan line SSL, the data line DL, the readout line RL (or the sensing line), the duty control line DCL (or the emission control line), and the pixel PXL may be provided in plural. The duty control line DCL may be disposed to correspond to the pixel PXL one-to-one, but is not limited thereto. For example, the duty control line DCL may be connected to the pixels PXL included in one pixel row together with the scan line SCL and the sensing scan line SSL, or may be connected to the pixels PXL included in one pixel column together with the data line DL and the readout line RL. For example, a disposition of the duty control line DCL is not limited to a given embodiment.

The pixel PXL may be disposed or positioned in an area (for example, a pixel area) partitioned by the scan line SCL (or the sensing scan line SSL) and the data line DL.

The pixel PXL may be connected to the scan line SCL, the sensing scan line SSL, the data line DL, the readout line RL, and the duty control line DCL.

The pixel PXL may be initialized using a reference voltage (or an initialization voltage) provided through the readout line RL in response to a sensing scan signal provided through the sensing scan line SSL, store or record a data signal (or a data voltage) provided through the data line DL in response to a scan signal provided through the scan line SCL, and may emit light with a luminance corresponding to the stored data signal. Here, a voltage level of the reference voltage may be set to be lower than an operation point (or a threshold voltage) of the light emitting element in the pixel PXL. An emission duty (or an emission time) of the light emitting element may be varied in response to a duty control signal (an emission duty control signal, or an emission control signal) provided through the duty control line DCL. A detailed configuration of the pixel PXL is described later with reference to FIG. 3.

The scan driver 120 may generate the scan signal based on a scan control signal SCS and provide the scan signal to the scan line SCL. Here, the scan control signal SCS may include a start signal, a clock signal, and the like, and may be provided from the timing controller 133 to the scan driver 120. For example, the scan driver 120 may be implemented with a shift register that generates and outputs the scan signal by sequentially shifting the start signal of a pulse shape using the clock signals. Similar to a method of generating the scan signal, the scan driver 120 may generate a sensing scan signal and provide the sensing scan signal to the sensing scan line SSL.

The scan driver 120 may be formed on the display unit 110 together with the pixel PXL. However, the disclosure is not limited thereto. For example, the scan driver 120 may be mounted on a circuit film and may be connected to the timing controller 133 via at least one circuit film and a printed circuit board.

The data driver 131 may generate the data signal (or the data voltage) based on image data DATA2 and a data control signal DCS provided from the timing controller 133, and provide the data signal to the display unit 110 (or the pixel PXL) through the data line DL. Here, the data control signal DCS may be a signal that controls an operation of the data driver 131, and may include a load signal (or a data enable signal) instructing an output of a valid data signal, a horizontal start signal, a data clock signal, and the like within the spirit and the scope of the disclosure. For example, the data driver 131 may include a shift register generating a sampling signal by shifting the horizontal start signal in synchronization with the data clock signal, a latch latching the image data DATA2 in response to the sampling signal, a digital-to-analog converter (or a decoder) converting latched image data (for example, digital data) into an analog data signal, and a buffer (or an amplifier) outputting the data signal to the data line DL. The data driver 131 may provide the reference voltage to the display unit 110 (or the pixel PXL) through the readout line RL.

The data driver 131 may provide a test signal (or a test voltage) to the pixel PXL through the data line DL in a separate sensing mode or sensing period (for example, in a sensing period allocated to sense an electrical characteristic of the pixel PXL, such as a threshold voltage, mobility, and/or the like of a driving transistor included in the pixel PXL), and may receive a sensing signal through the pixel PXL. The sensing signal may be used to compensate for the electrical characteristic (or a characteristic deviation) of the pixel PXL in at least one of the data driver 131, the duty controller 132, and the timing controller 133.

The duty controller 132 may generate the duty control signal based on a duty driving control signal DCCS (or an emission driving control signal) provided from the timing controller 133, and provide the duty control signal to the display unit 110 (or the pixel PXL) through the duty control line DCL. Here, the duty driving control signal DCCS may include the image data DATA2. For example, the duty controller 132 may include a pulse generator, and the pulse generator may generate and output a pulse signal corresponding to a grayscale value. Here, the grayscale value (or a grayscale) may be included in the image data DATA2 and may correspond to the pixel PXL. The pulse signal (or the duty control signal) may be a signal of a shape of a quadrangle wave having a duty ratio (or an on-duty ratio) corresponding to the grayscale value.

In embodiments, in case that the grayscale value is greater than or equal to a reference grayscale, the driver 130 may vary a voltage level of the data signal according to the grayscale value through the data driver 131, and may fix the duty ratio of the duty control signal through the duty controller 132 (for example, the duty ratio of the duty control signal is (about) 0% or (about) 100%). Here, the reference grayscale may be a criterion for dividing sections in which light efficiency (or emission efficiency) of the light emitting element in the pixel PXL is higher or lower than reference efficiency (or target efficiency). The light efficiency of the light emitting element and the reference grayscale according thereto are described later with reference to FIG. 4. For example, in a grayscale section in which the light efficiency of the light emitting element in the pixel PXL is greater than or equal to the reference efficiency, the driver 130 may control the luminance of the pixel PXL in a method of varying the data signal according to the grayscale value.

In case that the grayscale value is less than the reference grayscale, the driver 130 may fix the voltage level of the data signal through the data driver 131 (for example, to a voltage level at which the light efficiency of the light emitting element of the pixel PXL is maximized), and may vary the duty ratio of the duty control signal through the duty controller 132. For example, in a grayscale section (for example, a low grayscale section) in which the light efficiency of the light emitting element in the pixel PXL is lower than the reference efficiency, the driver 130 may control the luminance of the pixel PXL in a method of varying the emission duty (or the emission time) of the pixel PXL according to the grayscale value.

As will be described later with reference to FIG. 4, in the low grayscale section (or a section in which the luminance is relatively low), the light efficiency of the light emitting element may be decreased (or may be rapidly decreased or changed), precisely controlling the luminance of the light emitting element or compensating for the characteristic deviation of the light emitting element may be difficult only by varying the data signal (or a driving current flowing through the light emitting element according to the data signal), and thus a stain due to the characteristic deviation or the like may occur in an image of a relatively low luminance. Therefore, the display device 100 may adjust the luminance of the pixel PXL by maintaining the light efficiency of the light emitting element in the low grayscale section to be in a relatively high state similar to the light efficiency in other grayscale sections and varying the emission duty (or the emission time) of the pixel PXL. A stain may not occur in an image of a relatively low luminance, and display quality of the image displayed on the display device 100 may be improved.

The timing controller 133 may receive input image data DATA1 and a control signal CS from the outside (for example, a graphic processor), generate the scan control signal SCS and the data control signal DCS based on the control signal CS, and generate the image data DATA2 by converting the input image data DATA1. The timing controller 133 may generate the duty driving control signal DCCS based on the control signal CS and the image data DATA2. The control signal CS may include a vertical synchronization signal, a horizontal synchronization signal, a reference clock signal, and the like within the spirit and the scope of the disclosure. The vertical sync signal may indicate a start of frame data (for example, data corresponding to a frame section in which one frame image is displayed), and the horizontal sync signal may indicate a start of a data row (for example, one data row among data rows included in the frame data). For example, the timing controller 133 may convert the input image data DATA1 into the image data DATA2 having a format matching a pixel arrangement in the display unit 110.

In embodiments, the display device 100 may further include a power supply. The power supply may supply a first power voltage and a second power voltage to the display unit 110. The first and second power voltages may be power voltages or driving voltages required for an operation of the pixel PXL. The power supply may provide a reference voltage to the data driver 131. The power supply may provide a power voltage required for driving at least one of the scan driver 120, the data driver 131, the duty controller 132, and the timing controller 133 to the at least one of the scan driver 120, the data driver 131, the duty controller 132, and the timing controller 133. The power supply may be implemented as a power management integrated circuit (PMIC).

As described above, the display device 100 may control the luminance of the pixel PXL in a method of varying the emission duty (or the emission time) of the pixel PXL according to the grayscale value in the low grayscale section in which the light efficiency of the light emitting element in the pixel PXL is lower than the reference efficiency. Since the light efficiency of the light emitting elements are uniformly maintained in a relatively high state even in the low grayscale section, a stain phenomenon caused by low light efficiency (and a light efficiency related characteristic deviation) of the light emitting elements may be removed from the image, and the display quality of the display device 100 may be improved.

The data driver 131, the duty controller 132, and the timing controller 133 may be implemented as one driver 130 (for example, one integrated circuit), but are not limited thereto. For example, the data driver 131, the duty controller 132, and the timing controller 133 may be implemented as separate integrated circuits, or only two of the data driver 131, the duty controller 132, and the timing controller 133 may be implemented as one integrated circuit.

Figure 3:
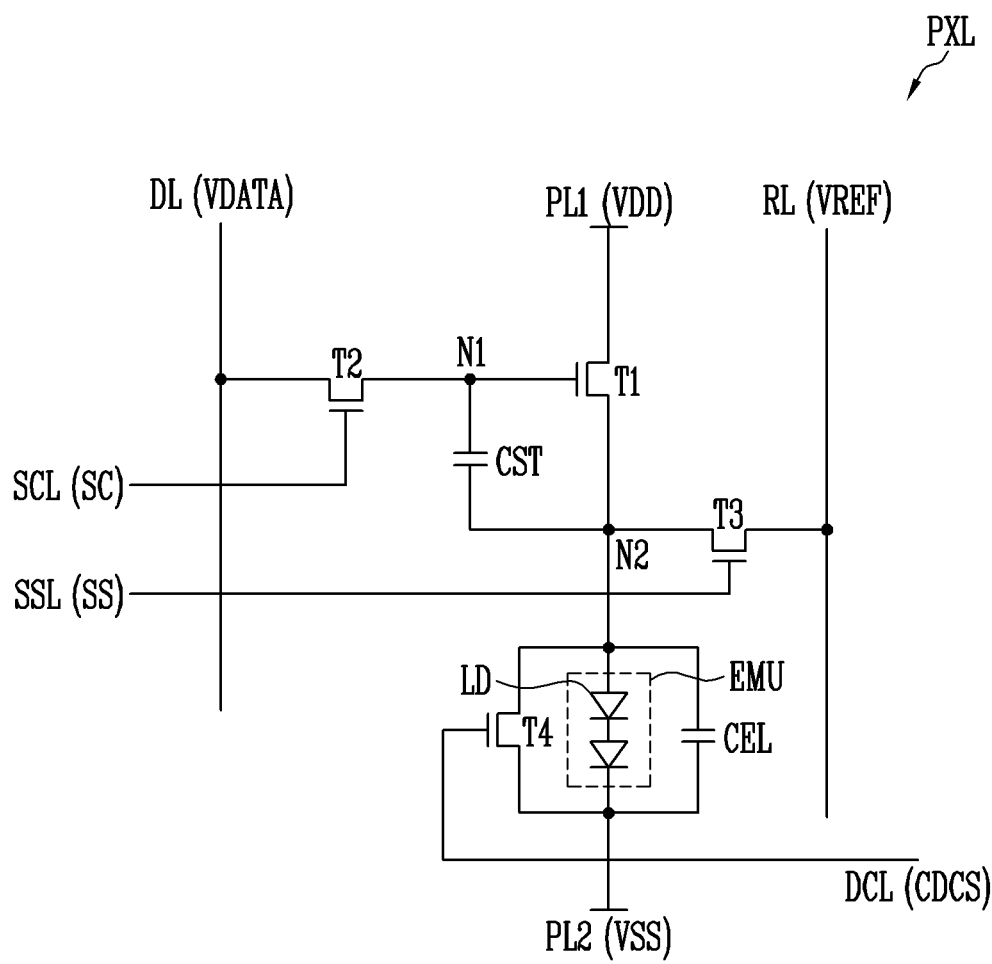
FIG. 3 is a schematic diagram illustrating an embodiment of a pixel included in the display device of FIG. 2.

FIG. 3 is a schematic diagram illustrating an embodiment of the pixel included in the display device of FIG. 2.

Referring to 2 and 3, the pixel PXL may be connected to the scan line SCL, the sensing scan line SSL, the data line DL, the readout line RL, and the duty control line DCL.

The pixel PXL may include a light emitting unit EMU, a first transistor T1 (or a driving transistor), a second transistor T2 (or a first switching transistor), a third transistor T3 (a sensing transistor, a second switching transistor, or an initialization transistor), a fourth transistor T4 (a duty control transistor, or an emission control transistor), and a storage capacitor CST. Each of the first to fourth transistors T1 to T4 may be a thin film transistor including an oxide semiconductor, but is not limited thereto. For example, at least some (or a number) of the first to fourth transistors T1 to T4 may include a polysilicon semiconductor or may be implemented with an N-type semiconductor or a P-type semiconductor.

The light emitting unit EMU may include at least one light emitting element LD connected between a first power line PL1 and a second power line PL2. A first power voltage VDD may be applied to the first power line PL1, and a second power voltage VSS may be applied to the second power line PL2. The first and second power voltages VDD and may be power voltages or driving voltages required for the operation of the pixel PXL, and the first power voltage VDD may have a voltage level higher than a voltage level of the second power voltage VSS.

For example, as shown in FIG. 3, the light emitting unit EMU may include two light emitting elements LD interconnected in series between the first power line PL1 and the second power line PL2. However, the number of light emitting elements LD interconnected in series is not limited thereto. For example, the light emitting unit EMU may include four or more light emitting elements LD interconnected in series. As another example, the light emitting unit EMU may include light emitting elements LD connected in parallel instead of light emitting elements LD interconnected in series. As still another example, the light emitting unit EMU may include light emitting elements LD connected in a series/parallel mixed structure.

The light emitting element LD may be the light emitting element LD shown in FIGS. 1A and 1B, but the type of the light emitting element LD is not limited thereto. For example, the light emitting element LD may be formed of an inorganic light emitting diode such as a micro light emitting diode (LED) or a quantum dot light emitting diode. As another example, the light emitting element LD may be an organic light emitting diode or a light emitting diode of an organic material and an inorganic material in combination.

A first electrode of the light emitting unit EMU (or the light emitting element LD) may be connected to (or electrically connected to) a second node N2 (or a second electrode of the first transistor T1). The first electrode of the light emitting unit EMU may be an anode electrode. The first electrode of the light emitting unit EMU may be connected (or electrically connected) to the first power line PL1 via the first transistor T1. A second electrode of the light emitting unit EMU (or the light emitting element LD) may be connected to the second power line PL2. The second electrode of the light emitting unit EMU may be a cathode electrode. The light emitting unit EMU (or the light emitting element LD) may generate light of a luminance in response to a current amount (or a driving current) supplied from the first transistor T1.

According to an embodiment, the light emitting unit EMU may further include an emission capacitor CEL connected to at least one light emitting element LD in parallel.

A first electrode of the first transistor T1 may be connected to the first power line PL1, and a second electrode of the first transistor T1 may be connected to the second node N2. The first electrode of the first transistor T1 may be a drain electrode, and the second electrode of the first transistor T1 may be a source electrode. A gate electrode of the first transistor T1 may be connected to a first node N1. The first transistor T1 may control a current amount flowing to the light emitting unit EMU in response to a voltage of the first node N1 (or a gate-source voltage applied between the second electrode and the gate electrode of the first transistor T1).

A first electrode of the second transistor T2 may be connected to the data line DL, and a second electrode of the second transistor T2 may be connected to the first node N1. A gate electrode of the second transistor T2 may be connected to the scan line SCL. In case that a scan signal SC of a turn-on voltage level is supplied to the scan line SCL, the second transistor T2 may be turned on to transmit a data signal VDATA (or a data voltage) from the data line DL to the first node N1.

The storage capacitor CST may be formed or connected between the first node N1 and the second node N2 (or the first electrode of the light emitting unit EMU). The storage capacitor CST may store the voltage of the first node N1, or a charge corresponding to the voltage of the first node N1 may be charged in the storage capacitor CST.

A first electrode of the third transistor T3 may be connected to the second node N2, and a second electrode of the third transistor T3 may be connected to the readout line RL. A gate electrode of the third transistor T3 may be connected to the sensing scan line SSL. In case that a sensing scan signal SS of a turn-on voltage level is supplied to the sensing scan line SSL, the third transistor T3 may be turned on to connect the second node N2 and the readout line RL. A reference voltage VREF applied to the readout line RL may be applied to the second node N2. A voltage of the second node N2 or the first electrode of the light emitting unit EMU may be initialized by the reference voltage VREF.

In case that the second transistor T2 and the third transistor T3 are simultaneously turned on in response to the scan signal SC and the sensing scan signal SS, a voltage difference between the data signal VDATA and the reference voltage VREF is stored the storage capacitor CST, and the first transistor T1 may control the current amount flowing through the light emitting unit EMU in response to the voltage difference stored in the storage capacitor CST.

By way of example, in case that a state in which the second node N2 and the readout line RL are connected by the third transistor T3 is maintained, the sensing signal (or the current amount) corresponding to the voltage difference (for example, the voltage difference between the data signal VDATA and the reference voltage VREF) may be output from the pixel PXL through the readout line RL. For example, in case that the first transistor T1 is turned on by a test signal (for example, a test signal or a test voltage applied as the data signal VDATA) in the sensing period, a current flowing through the first transistor T1 may be output through the readout line RL as the sensing signal in response to the test signal.

A first electrode of the fourth transistor T4 may be connected to the second node N2, and a second electrode of the fourth transistor T4 may be connected to the second power line PL2. A gate electrode of the fourth transistor T4 may be connected to the duty control line DCL. In case that a duty control signal CDCS of a turn-on voltage level is supplied to the duty control line DCL, the fourth transistor T4 may be turned on, and the driving current may flow through the fourth transistor T4 instead of the light emitting unit EMU. For example, in case that the fourth transistor T4 is turned on, the light emitting unit EMU (or the pixel PXL) may not emit light. As the duty ratio (or the on-duty ratio) of the duty control signal CDCS increases, the emission time of the light emitting unit EMU may be shortened.

As described above, the pixel PXL may include the fourth transistor T4 connected to the light emitting unit EMU in parallel, for example, connected to both ends of the light emitting unit EMU, and the luminance of the pixel PXL may be controlled by the duty ratio of the duty control signal CDCS provided to the gate electrode of the fourth transistor T4.

In an embodiment, the pixel PXL is not limited to the circuit structure shown in FIG. 3.

Figure 4:
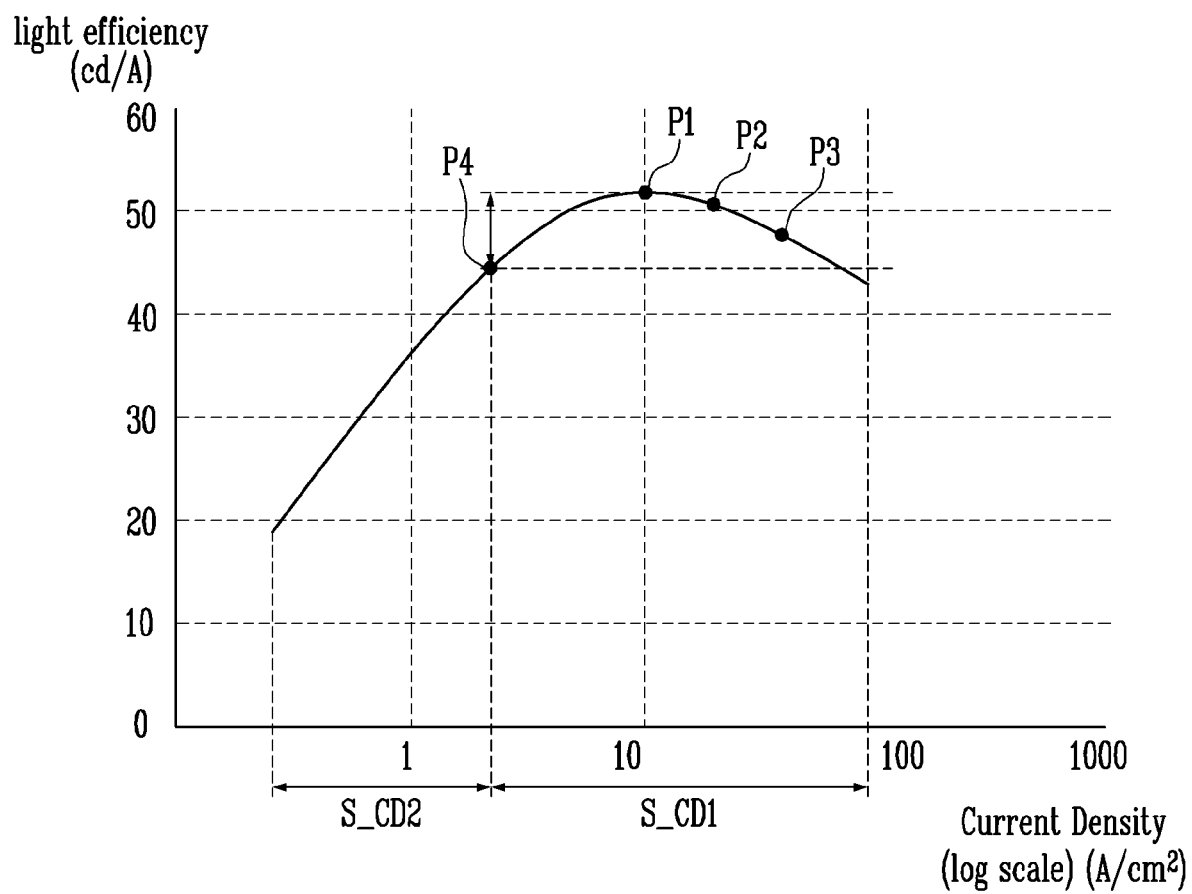
FIG. 4 is a schematic diagram illustrating light efficiency of the light emitting element included in the pixel of FIG. 3.

FIG. 4 is a schematic diagram illustrating the light efficiency of the light emitting element included in the pixel of FIG. 3.

Referring to FIGS. 1A, 1B, and FIGS. 2 to 4, the light efficiency of the light emitting element LD (for example, inorganic light emitting diode) may vary according to a current density of the driving current flowing through the light emitting element LD. The light efficiency may mean intensity of light according to a unit current. As the grayscale value of the pixel PXL increases, the driving current may increase, and the current density of the driving current may also increase in proportion to the driving current.

As shown in FIG. 4, in case that the current density is about 10 A/cm$^2$, the light efficiency may become maximum, and the light efficiency may decrease as the current density increases or decreases based on about 10 A/cm$^2$. For example, based on a total of 256 grayscales, in case that the grayscale value corresponding to the pixel PXL is within a range of about 80 grayscale to about 100 grayscale, the light efficiency may be maximum (first point P1).

In a first current section S_CD1, the light efficiency may be maintained at about 45 cd/A or more. For example, with respect to a full white image of which a luminance of the display device 100 is about 500 nits (for example, in case that the grayscale value is 128 grayscale), the current density may be about 20.9 A/cm$^2$ and the light efficiency may be about 51.0 cd/A (second point P2). For example, with respect to a full white image of which the luminance of the display device 100 is about 1000 nits (for example, in case that the grayscale value is 255 grayscale), the current density may be about 49.3 A/cm$^2$ and the light efficiency may be about 48.0 cd/A (third point P3). For example, in case that the grayscale value is 32 grayscale, the current density may be about 1.62 A/cm$^2$ and the light efficiency may be about 45.0 cd/A (fourth point P4).

On the other hand, in a second current section S_CD2, the light efficiency may become lower than about 45 cd/A. For example, in case that the grayscale value is less than 32 grayscale, the current density may be less than about 1.62 A/cm$^2$, and the light efficiency may become lower than 45 cd/A. For example, in case that the grayscale value is 16 grayscale, the current density may be about 0.52 A/cm$^2$, and the light efficiency may become lower than 30 cd/A.

In the first current section S_CD1, a change of the light efficiency according to a change of the current density may not be relatively large, but in the second current section S_CD2, the light efficiency according to the change of the current density may rapidly change or may be rapidly decreased.

For reference, a deviation may exist in emission characteristics of the light emitting elements LD included in one pixel PXL or pixels PXL. In the first current section S_CD1, since the change of the light efficiency according to the current density is not relatively large, a light efficiency deviation between the light emitting elements LDs may hardly occur, the light emitting elements LD may emit with substantially the same luminance, and the image may be normally displayed on the display device 100. On the other hand, in the second current section S_CD2, since the change of the light efficiency according to the current density is relatively large, the light efficiency deviation between the light emitting elements LD may occur greatly, the light emitting elements LD may emit light with different luminances due to the light efficiency deviation, and a stain may occur in the image displayed on the display device 100.

Therefore, the display device 100 may use only the first current section S_CD1 in which the light efficiency is greater than the reference efficiency (or the target efficiency, for example, about 45 cd/A). The display device 100 may express a luminance (or a grayscale) corresponding to the second current section S_CD2 by varying the emission duty (or the emission time) of the light emitting element LD (or the pixel PXL).

Figure 5A:
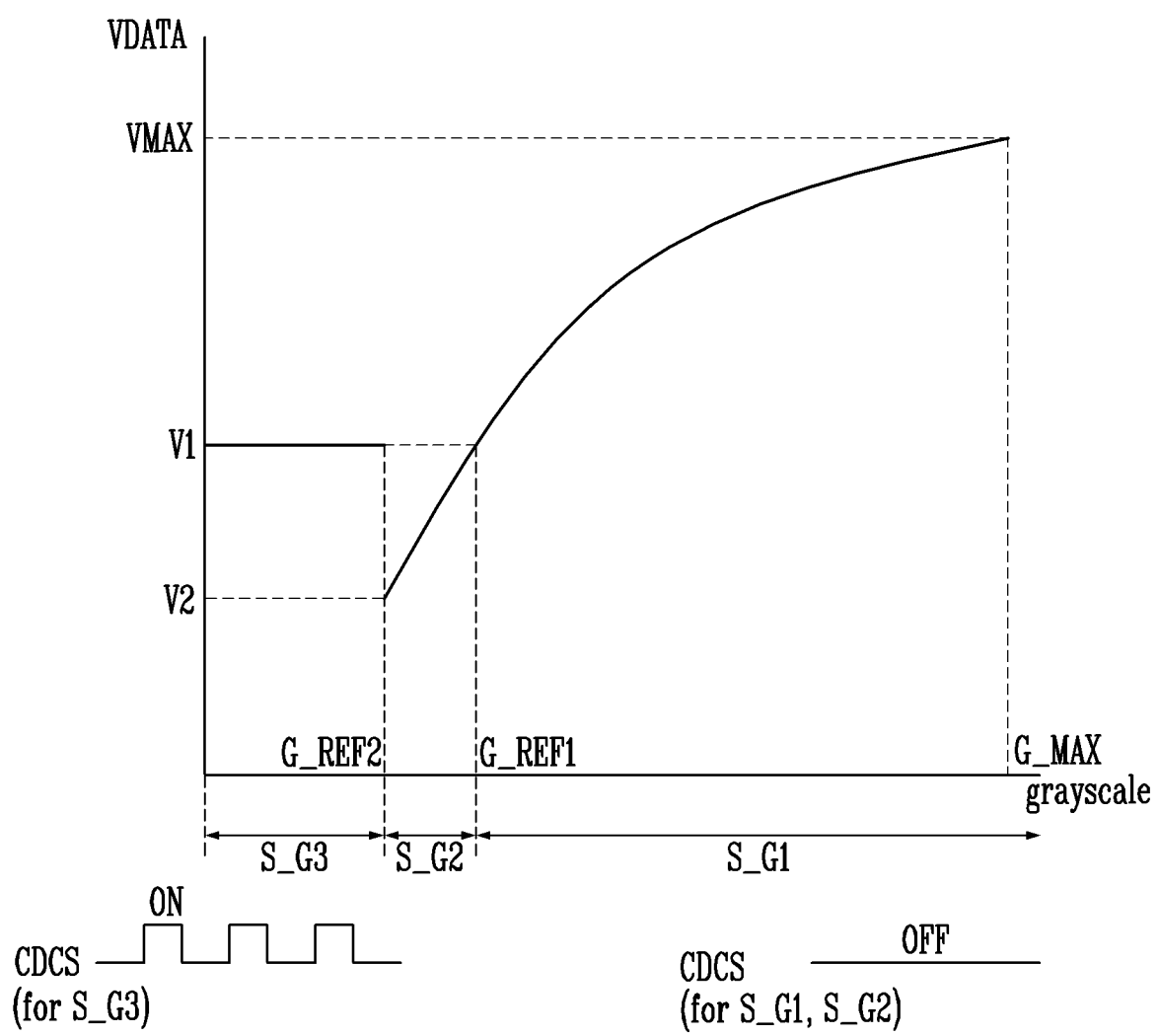
FIG. 5A is a schematic diagram illustrating an embodiment of a data signal provided to the pixel of FIG. 3.
Figure 5B:
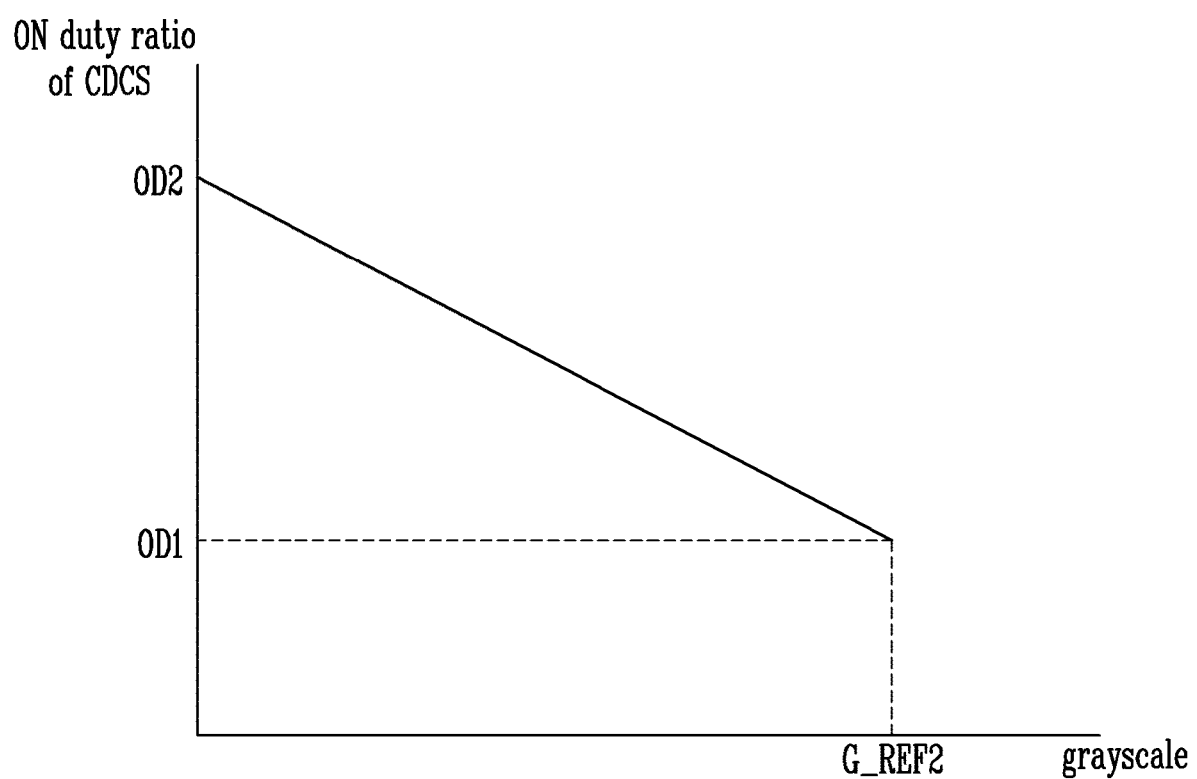
FIG. 5B is a schematic diagram illustrating an embodiment of a duty control signal provided to the pixel of FIG. 3.

FIG. 5A is a schematic diagram illustrating an embodiment of the data signal provided to the pixel of FIG. 3. FIG. 5A shows a relationship between the grayscale and the data signal VDATA. FIG. 5B is a schematic diagram illustrating an embodiment of the duty control signal provided to the pixel of FIG. 3. FIG. 5B shows a relationship between the grayscale and the on-duty ratio of the duty control signal CDCS.

First, referring to FIGS. 2 to 4 and 5A, based on a first reference grayscale G_REF1 and a second reference grayscale G_REF2, the grayscales may be divided into a first grayscale section S_G1, a second grayscale section S_G2, and a third grayscale section S_G3.

The first reference grayscale G_REF1 may be a grayscale corresponding to the first point P1 of FIG. 4, and for example, the first reference grayscale G_REF1 may be within a range of about 80 to about 100 grayscale. However, the disclosure is not limited thereto, and the first reference grayscale G_REF1 may be an arbitrary grayscale corresponding to the first current section S_CD1 of FIG. 4.

The second reference grayscale G_REF2 may be a grayscale corresponding to the fourth point P4 of FIG. 4, and for example, the second reference grayscale G_REF2 may be 32 grayscale. However, the disclosure is not limited thereto, and the second reference grayscale G_REF2 may vary according to a setting of the reference efficiency of the light emitting element LD.

In the first and second grayscale sections S_G1 and S_G2, the voltage level of the data signal VDATA may vary according to the grayscale. For example, in case that the grayscale value corresponding to the pixel PXL is within the first and second grayscale sections S_G1 and S_G2, the driver 130 (refer to FIG. 2) may vary the voltage level of the data signal VDATA according to the grayscale value.

For example, the data signal VDATA may have a maximum voltage level VMAX in response to a maximum grayscale G_MAX (for example, 255 grayscale), have a first voltage level V1 in response to the first reference grayscale G_REF1, and have a second voltage level V2 in response to the second reference grayscale G_REF2. The first voltage level V1 may be lower than the maximum voltage level VMAX, and the second voltage level V2 may be lower than the first voltage level V1. For example, in the first and second grayscale sections S_G1 and S_G2, as the grayscale value decreases, the voltage level of the data signal VDATA may decrease. However, the disclosure is not limited thereto. For example, in case that the first transistor T1 of FIG. 3 is implemented with a P-type transistor instead of an N-type transistor, in the first and second grayscale sections S_G1 and S_G2, as the grayscale value decreases, the voltage level of the data signal VDATA may increase.

In the first and second grayscale sections S_G1 and S_G2, the duty control signal CDCS may be maintained as a turn-off voltage level OFF. For example, in the first and second grayscale sections S_G1 and S_G2, the on-duty ratio of the duty control signal CDCS may be 0. For example, in case that the grayscale value corresponding to the pixel PXL is within the first and second grayscale sections S_G1 and S_G2, the driver 130 (refer to FIG. 2) may not control or may not vary the emission duty (or the emission time).

In embodiments, in the third grayscale section S_G3, the voltage level of the data signal VDATA may be fixed (or constant) or maintained as a specific or given voltage level regardless of the grayscale. For example, in case that the grayscale value corresponding to the pixel PXL is within the third grayscale section S_G3, the driver 130 (refer to FIG. 2) may fix the voltage level of the data signal VDATA. The voltage level of the data signal VDATA in the third grayscale section S_G3 may be included in a range of the voltage level (for example, a voltage range) of the data signal VDATA in the first grayscale section S_G1, and may be greater than the voltage level of the data signal VDATA in the second grayscale section S_G2. The voltage level of the data signal VDATA in the third grayscale section S_G3 may be different from the voltage level of the data signal VDATA in the second grayscale section S_G2, and the voltage level of the data signal VDATA may be substantially discontinuous in a boundary between the second grayscale section S_G2 and the third grayscale section S_G3.

For example, in the third grayscale section S_G3, the data signal VDATA may have the first voltage level V1. In the third grayscale section S_G3 in which the grayscale (or luminance) is relatively low, a small luminance deviation may also be recognized, and thus the first voltage level V1 corresponding to the first point P1 (refer to FIG. 4) may be used. At the first point, the change of the light efficiency according to the current density change may be 0, and thus the light efficiency deviation between the light emitting elements LD may be minimal or may not occur substantially. However, the data signal VDATA is not limited thereto, and the voltage level of the data signal VDATA may be differently set in the third grayscale section S_G3 in consideration of power consumption and the range of the duty ratio of the duty control signal CDCS.

In the third grayscale section S_G3, the duty ratio of the duty control signal CDCS may vary. For example, in case that the grayscale value corresponding to the pixel PXL is within the third grayscale section S_G3, the driver 130 (refer to FIG. 2) may vary the emission duty (or the emission time) of the pixel PXL (refer to FIG. 2).

In an embodiment, in the third grayscale section S_G3, the on-duty ratio of the duty control signal CDCS may increase as the grayscale decreases. For example, in case that the grayscale is equal to or similar to the second reference grayscale G_REF2, the on-duty ratio of the duty control signal CDCS may have a first value OD1. In case that the grayscale is a minimum grayscale, the on-duty ratio of the duty control signal CDCS may have a second value OD2, and the second value OD2 may be greater than the first value OD1. The first value OD1 may be set based on the luminance of the light emitting element LD according to the second voltage level V2 and the luminance of the light emitting element LD according to the second reference grayscale G_REF2, and for example, the first value OD1 may be about 30%. The second value OD2 may also be set based on the luminance of the light emitting element LD according to the second voltage level V2 and the luminance of the light emitting element LD according to the minimum grayscale, and for example, the second value OD2 may be about 90%. The range of the on-duty ratio of the duty control signal CDCS may be varied according to the second voltage level V2, and the range of the on-duty ratio of the duty control signal CDCS may be within a range of about 10% to about 90%, but is not limited thereto.

In FIG. 5B, a change rate (or a slope) of the on-duty ratio of the duty control signal CDCS is constant, but this is by way of example, and the disclosure is not limited thereto. The change rate of the on-duty ratio of the duty control signal CDCS may vary according to the grayscale.

In FIG. 5B, the on-duty ratio of the duty control signal CDCS increases as the grayscale decreases in the third grayscale section S_G3, the on-duty ratio of the duty control signal CDCS is not limited thereto. For example, in case that the fourth transistor T4 of FIG. 3 is implemented with a P-type transistor instead of an N-type transistor, in the first and second grayscale sections S_G1 and S_G2, as the grayscale decreases, the on-duty ratio of the duty control signal CDCS may also increase.

As described above, the display device 100 may vary the voltage level of the data signal VDATA in the first and second grayscale sections S_G1 and S_G2, and may vary the duty ratio of the duty control signal CDCS in a state in which the voltage level of the data signal VDATA is fixed in the third grayscale section S_G3.

In the third grayscale section S_G3, the data signal VDATA may have the first voltage level V1 at which the light efficiency of the light emitting element LD becomes maximum. The luminance of the image corresponding to the third grayscale section S_G3 may be more uniform, and the display quality of the image may be further improved.

Figure 6:
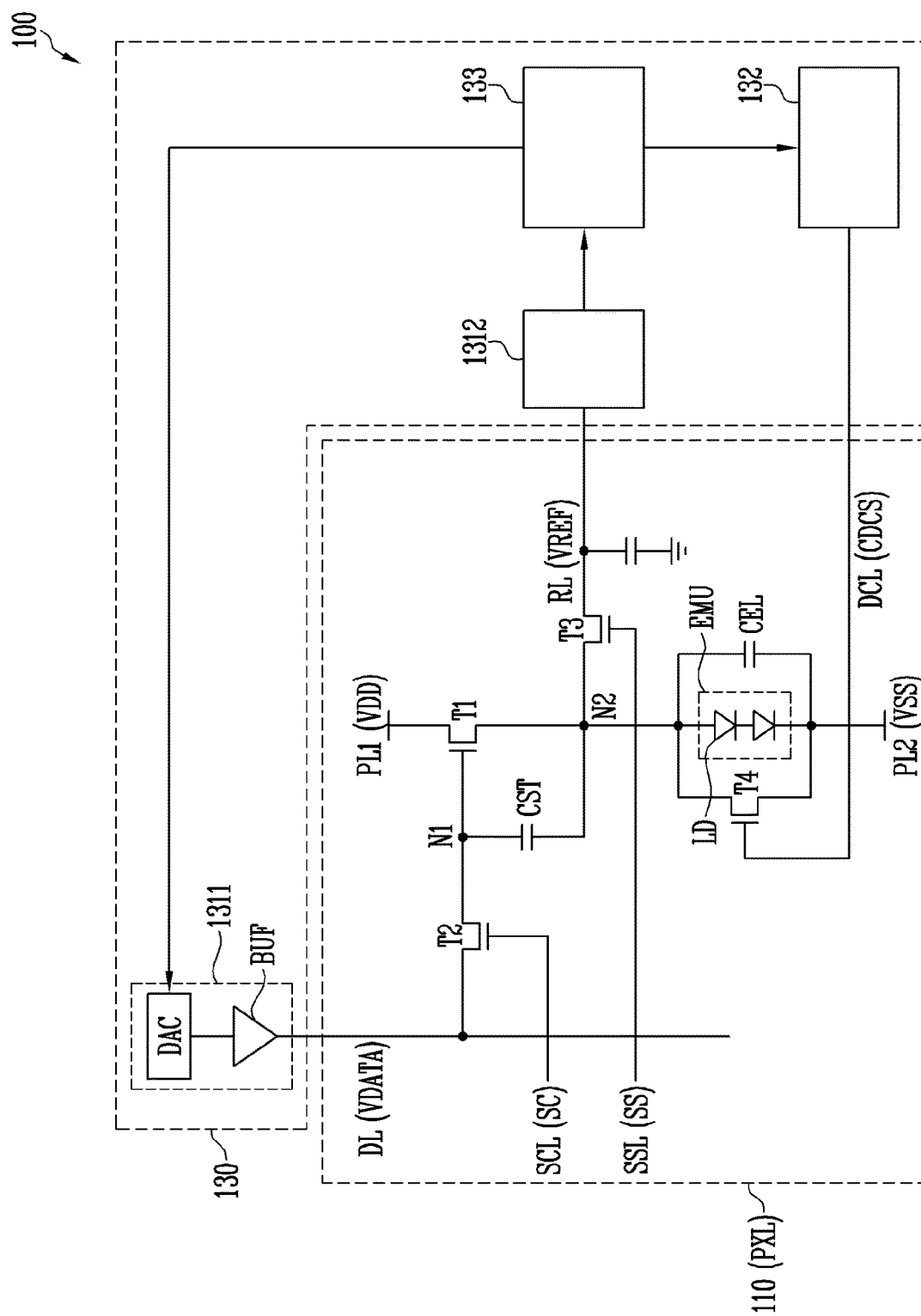
FIG. 6 is a schematic diagram illustrating an embodiment of a driver included in the display device of FIG. 2.

FIG. 6 is a schematic diagram illustrating an embodiment of the driver included in the display device of FIG. 2. In order to describe an operation of the driver 130 in relation to the display unit 110, the display unit 110 (or the pixel PXL) is further shown in FIG. 6.

Referring to FIGS. 2, 3, and 6, the driver 130 may include a data signal generation block 1311, a sensing block 1312, the duty controller 132, and the timing controller 133. The data signal generation block 1311 and the sensing block 1312 may be included in the data driver 131 (refer to FIG. 2).

The data signal generation block 1311 may provide the data signal VDATA to the data line DL. The data signal generation block 1311 may provide the test signal in the sensing period.

The data signal generation block 1311 may include a digital-to-analog converter DAC and a buffer BUF. As described with reference to FIG. 2, the data signal generation block 1311 may further include a shift register, a latch, and the like within the spirit and the scope of the disclosure.

The digital-to-analog converter DAC may convert a digital grayscale value (for example, the grayscale value corresponding to the pixel PXL) into an analog data signal VDATA. For example, the digital-to-analog converter DAC may select a gamma voltage corresponding to the grayscale value among gamma voltages and output the gamma voltage as the data signal VDATA.

The buffer BUF may output the data signal VDATA provided from the digital-to-analog converter DAC to the data line DL.

The sensing block 1312 may provide the reference voltage VREF to the pixel PXL through the readout line RL. The sensing block 1312 may receive the sensing signal (for example, current) corresponding to the test signal from the pixel PXL through the readout line RL in the sensing period. The sensing block 1312 may include an integrator (for example, an integrator including an amplifier, a capacitor, a switching element, and the like) for integrating the sensing signal, and a sampling circuit (for example, a sample circuit including a capacitor, a switching element, and the like) for sampling the integrated sensing signal. The sensing block 1312 may further include an analog-to-digital converter, and the analog-to-digital converter may convert the sampled signal into a digital sensing value and output the digital sensing value to the outside. The sensing value may include information on an electrical characteristic (for example, a threshold voltage of the first transistor T1) of the pixel PXL.

The timing controller 133 (or a correction block) may generate a correction signal based on the sensing value. Since the data signal VDATA is varied in case that the grayscale is greater than or equal to the second reference grayscale G_REF2 (refer to FIGS. 5A and 5B), the timing controller 133 may generate a first correction signal for the grayscale greater than or equal to the second reference grayscale G_REF2, and provide the first correction signal to the data signal generation block 1311. The data signal generation block 1311 may correct the data signal VDATA based on the first correction signal. For example, the data signal generation block 1311 may correct a voltage level of at least some of the gamma voltages based on the first correction signal. Since the duty ratio of the duty control signal CDCS is varied in case that the grayscale is less than the second reference grayscale G_REF2, the timing controller 133 may generate a second correction signal for the grayscale less than the second reference grayscale G_REF2, and provide the second correction signal to the duty controller 132. The duty controller 132 may correct the duty ratio of the duty control signal CDCS based on the second correction signal.

The timing controller 133 generating the correction signal may be physically implemented by a logic circuit, a microprocessor, a memory element, and other electronic circuits, and may be programmed and controlled using software, to perform a function of generating the correction signal.

In an embodiment, the timing controller 133 may provide a first grayscale value (or a signal corresponding to the first grayscale value) equal to or greater than the second reference grayscale G_REF2 to the data signal generation block 1311, and provide a second grayscale value (or a signal corresponding to the second grayscale value) less than the second reference grayscale G_REF2 to the duty controller 132. The data signal generation block 1311 may generate the data signal VDATA corresponding to the first grayscale value, and the duty controller 132 may generate the duty control signal CDCS corresponding to the second grayscale value.

Figure 7:
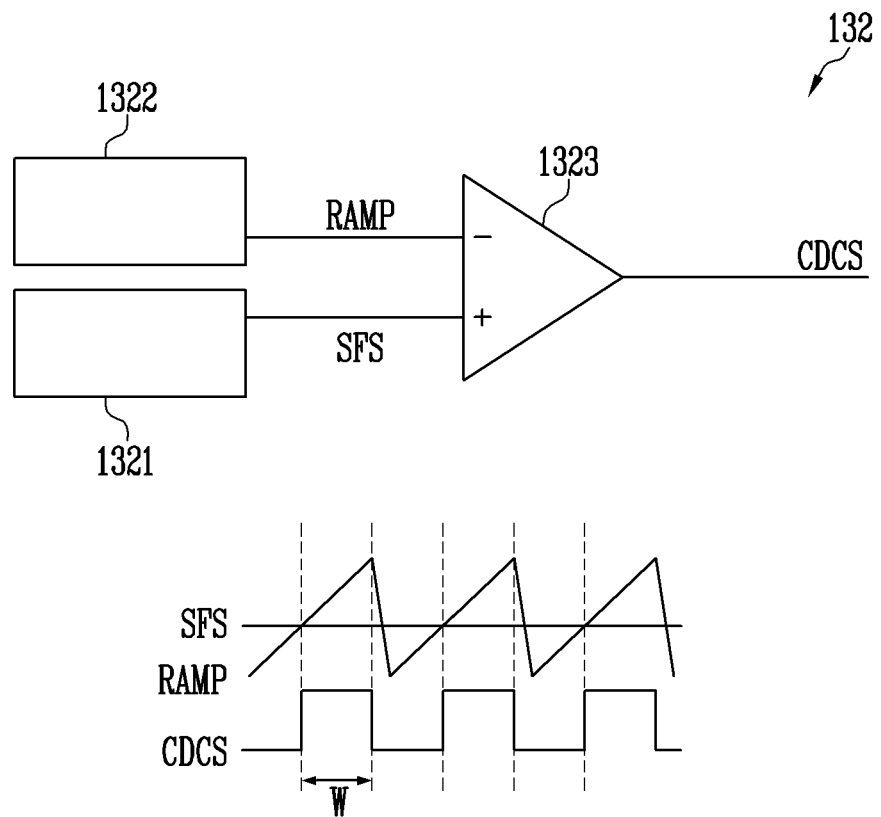
FIG. 7 is a schematic diagram illustrating an embodiment of a duty controller included in the driver of FIG. 6.
Figure 8:
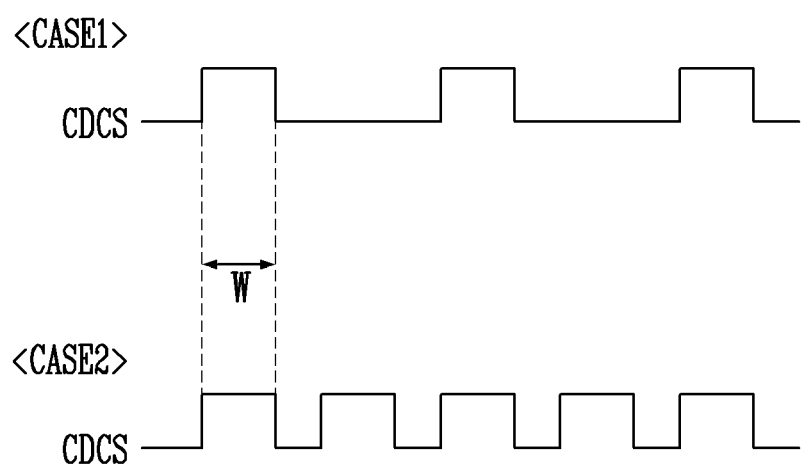
FIG. 8 is a schematic diagram illustrating an embodiment of a duty control signal output from the duty controller included in the driver of FIG. 6.

FIG. 7 is a schematic diagram illustrating an embodiment of the duty controller included in the driver of FIG. 6. FIG. 8 is a schematic diagram illustrating an embodiment of the duty control signal output from the duty controller included in the driver of FIG. 6.

Referring first to FIGS. 2, 5A, 5B, 6, and 7, the duty controller 132 (or a pulse generator) may include a control block 1321, an oscillator 1322, and a comparator 1323.

The control block 1321 may generate a first signal SFS based on the grayscale value. For example, the control block 1321 may generate the first signal SFS having a specific or given voltage level in response to the grayscale value. For example, the control block 1321 may be implemented as a digital-to-analog converter.

In an embodiment, the control block 1321 may generate the first signal SFS corresponding to the grayscale value by using a lookup table.

TABLE 1

| Grayscale value | First signal (SFS) |
|---|---|
| 1 G | 0.1 V |
| 10 G | 0.2 V |
| 20 G | 0.3 V |
| ... | ... |

Table 1 illustrates an example of a lookup table used in the control block 1321.

For example, the control block 1321 may generate a first signal SFS of 0.1V in response to 1 grayscale value (1G), generate a first signal SFS of 0.2V in response to 10 grayscale value (10G), and generate a first signal SFS of 0.3V in response to 20 grayscale value (20G). The control block 1321 may generate the first signal SFS for each of all grayscales (by way of example, grayscales less than the second reference grayscale G_REF2) by using interpolation or extrapolation. As the grayscale value increases, a voltage level of the first signal SFS may increase, but is not limited thereto.

The oscillator 1322 may generate a second signal RAMP. The second signal RAMP may be a sawtooth wave, but is not limited thereto. For example, the second signal RAMP may be a triangular wave or a sine wave.

The comparator 1323 may compare the first signal SFS and the second signal RAMP to output the duty control signal CDCS. For example, in case that a voltage level of the second signal RAMP is greater than or equal to the voltage level of the first signal SFS, the comparator 1323 may output a duty control signal CDCS of a turn-on voltage level (for example, a logic high level). In case that the voltage level of the second signal RAMP is less than the voltage level of the first signal SFS, the comparator 1323 may output a duty control signal CDCS of a turn-off voltage level (for example, a logic low level).

Since the voltage level of the first signal SFS decreases as the grayscale value decreases, a width W of a pulse having the turn-on voltage level (for example, a turn-on pulse) of the duty control signal CDCS may increase, and the on-duty ratio of the duty control signal CDCS may be increased. Therefore, the on-duty ratio of the duty control signal CDCS may vary according to the grayscale value.

The width W of the turn-on pulse of the duty control signal CDCS may vary in a state in which a frequency of the duty control signal CDCS is fixed, but is not limited thereto.

For example, as shown in FIG. 8, the width W of the turn-on pulse of the duty control signal CDCS may be fixed and the frequency of the duty control signal CDCS may be varied. For example, the frequency of the duty control signal CDCS in a first case may be greater than the frequency of the duty control signal CDCS in a second case, and the on-duty ratio of the duty control signal CDCS in the first case may be less than the on-duty ratio of the duty control signal CDCS in the second case. By way of example, the width of the turn-off pulse of the duty control signal CDCS may be fixed, and the frequency of the duty control signal CDCS may be varied.

As described above, the duty controller 132 may vary the on-duty ratio of the duty control signal CDCS by using a method of varying the width W of the turn-on pulse of the duty control signal CDCS (for example, pulse width modulation (PWM)) or a method of varying the frequency of the duty control signal CDCS (for example, pulse frequency modulation (PFM)).

Figure 9:
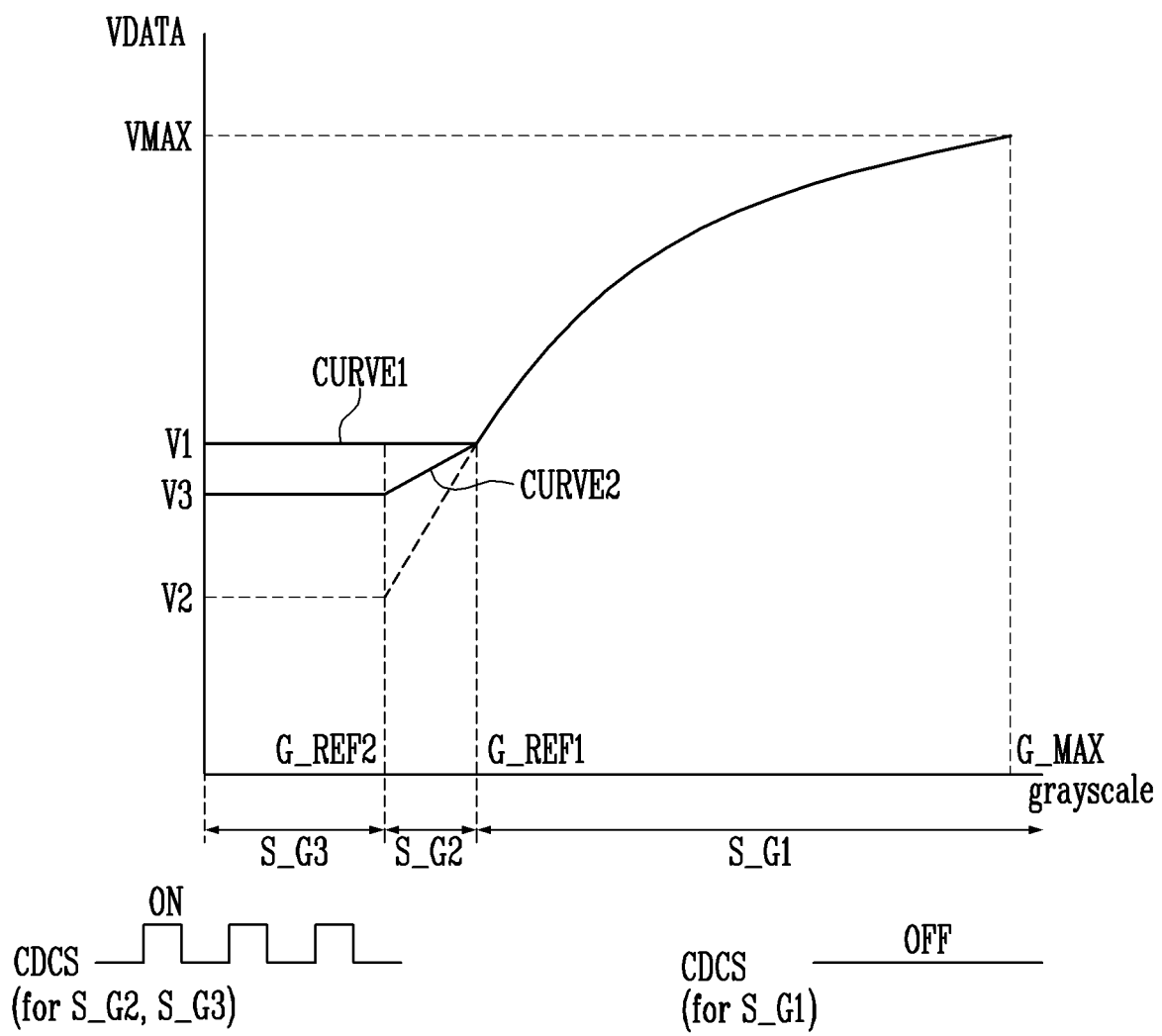
FIGS. 9 and 10 are schematic diagrams illustrating an embodiment of the data signal provided to the pixel of FIG. 3.
Figure 10:
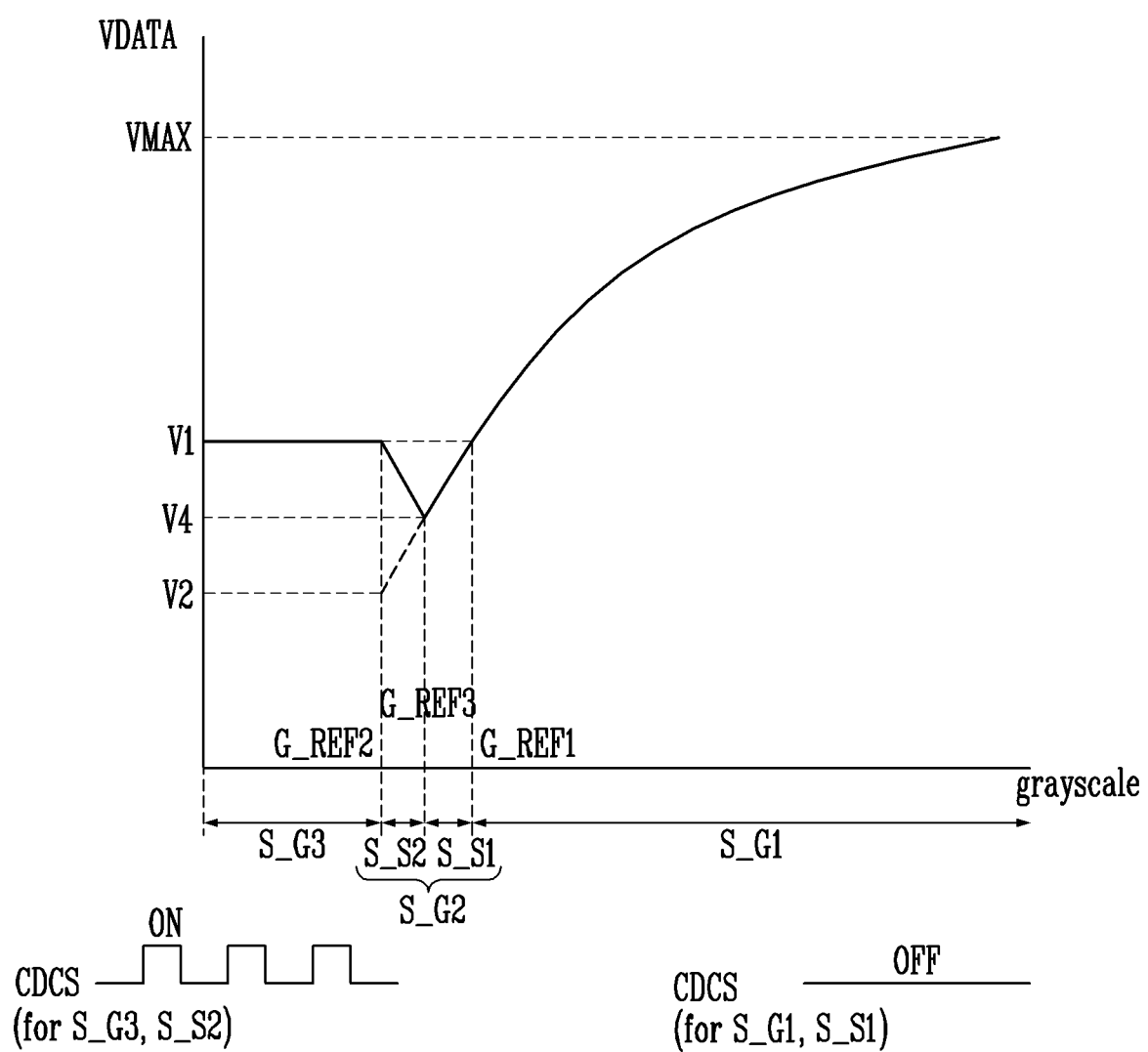

FIGS. 9 and 10 are schematic diagrams illustrating an embodiment of the data signal provided to the pixel of FIG. 3. FIGS. 9 and 10 show a relationship between the grayscale and the data signal VDATA.

First, referring to FIGS. 2 to 4 and 5A and 9, since the first reference grayscale G_REF1, the second reference grayscale G_REF2, the first grayscale section S_G1, the second grayscale section S_G2, the third grayscale section S_G3, and the data signal VDATA (and the duty control signal CDCS) in the first grayscale section S_G1 are described with reference to FIG. 5A, an overlapping description may not be repeated.

In an embodiment, the voltage level of the data signal VDATA may be fixed in the second grayscale section S_G2 and the third grayscale section S_G3 according to a first curve CURVE1. For example, in the second and third grayscale sections S_G2 and S_G3, the data signal VDATA may have the first voltage level V1. For example, in case that the grayscale value corresponding to the pixel PXL is within the second and third grayscale sections S_G2 and S_G3, the driver 130 (refer to FIG. 2) may fix the voltage level of the data signal VDATA.

In the second and third grayscale sections S_G2 and S_G3, the duty ratio of the duty control signal CDCS may vary. For example, in case that the grayscale value corresponding to the pixel PXL is within the second and third grayscale sections S_G2 and S_G3, the driver 130 (refer to FIG. 2) may vary the emission duty (or the emission time).

In a case of the embodiment of FIG. 5A, at a boundary between the second grayscale section S_G2 and the third grayscale section S_G3, the voltage level of the data signal VDATA and the duty ratio of the duty control signal CDCS may rapidly or discontinuously change. In grayscales adjacent to the boundary between the second grayscale section S_G2 and the third grayscale section S_G3, a luminance difference and deterioration of display quality may occur due to a difference (and an error proportional to the difference) of the data signal VDATA and a difference (and an error proportional to the difference) of duty ratio of the duty control signal CDCS. In order to prevent such a luminance difference, the voltage level of the data signal VDATA may be fixed so that the data signal VDATA substantially continuously changes in the second and third grayscale sections S_G2 and S_G3. However, the data signal VDATA is not limited thereto.

In an embodiment, according to a second curve CURVE2, the voltage level of the data signal VDATA may be varied in the second grayscale section S_G2, the voltage level of the data signal VDATA may be fixed in the third grayscale section S_G3, and the voltage level of the data signal VDATA may be substantially continuous in the second and third grayscale sections S_G2 and S_G3. Also, the duty ratio of the duty control signal CDCS may be varied in the second and third grayscale sections S_G2 and S_G3.

For example, the data signal VDATA may be varied within a range of the first voltage level V1 to a third voltage level V3 in the second grayscale section S_G2, and the data signal VDATA may have the third voltage level V3 in the second grayscale section S_G2. The third voltage level V3 may be lower than the first voltage level V1 (for example, the first voltage level V1 corresponding to the maximum light efficiency), and may be higher than the second voltage level V2 (for example, the second voltage level V2 corresponding to the reference efficiency).

For example, a variable range of the duty ratio of the duty control signal CDCS in the second grayscale section S_G2 may be insufficient or expressing the grayscale may be insufficient only by varying the duty ratio of the duty control signal CDCS in the second grayscale section S_G2. Therefore, the grayscale in the second grayscale section S_G2 may be more readily expressed by varying the data signal VDATA in the second grayscale section S_G2.

The duty ratio of the duty control signal CDCS may be varied in the second grayscale section S_G2, but is not limited thereto. For example, the duty ratio of the duty control signal CDCS may be fixed to a specific or given value (for example, about 10%) in the second grayscale section S_G2.

The voltage level of the data signal VDATA decreases as the grayscale decreases according to the second curve CURVE2, but the disclosure is not limited thereto.

In an embodiment, in a portion of the second grayscale section S_G2, the voltage level of the data signal VDATA may increase as the grayscale decreases.

As shown in FIG. 10, the second grayscale section S_G2 may include a first sub-section S_S1 and a second sub-section S_S2. For example, the second grayscale section S_G2 may be divided into the first subsection S_S1 and the second subsection S_S2 based on a third reference grayscale G_REF3. The third reference grayscale G_REF3 may be any grayscale between the first reference grayscale G_REF1 and the second reference grayscale G_REF2. For example, in case that the first reference grayscale G_REF1 is within a range of about 80 grayscale to about 100 grayscale and the second reference grayscale G_REF2 is 32 grayscale, the third reference grayscale G_REF3 may be 64 grayscale. However, the third reference grayscale G_REF3 is not limited thereto. The voltage level of the data signal VDATA may decrease as the grayscale decreases in the first sub-section S_S1. For example, the data signal VDATA may be varied from the first voltage level V1 to a fourth voltage level V4 in the first sub-section S_S1. The voltage level of the data signal VDATA may increase as the grayscale decreases in the second sub-section S_S2. For example, the data signal VDATA may be varied from the fourth voltage level V4 to the first voltage level V1 in the first sub-section S_S1. A first voltage range of the data signal VDATA in the first grayscale section S_G1 and a second voltage range of the data signal VDATA in the second grayscale section S_G2 may not overlap each other, and the data signal VDATA may have the first voltage level V1 at a boundary between the first voltage range and the second voltage range in the third grayscale section S_G3.

In the first sub-section S_S1, the duty control signal CDCS may be maintained as the turn-off voltage level OFF, and in the second sub-section S_S2, the duty ratio of the duty control signal CDCS may be variable.

For example, in the first sub-section S_S1, by varying the data signal VDATA and thus decreasing the current amount flowing through the pixel PXL, power consumption may be reduced. In the second sub-section S_S2, by varying each of the data signal VDATA and the duty ratio of the duty control signal CDCS, a rapid change of a luminance that may occur at a boundary between the first sub-section S_S1 and the third grayscale section S_G3 may be prevented. Furthermore, in the third sub-section S_S3, by using the data signal VDATA having the first voltage level V1 corresponding to the maximum light efficiency, a luminance deviation and deterioration of the display quality due to the data signal VDATA may be prevented.

As described above, in at least a portion of the second grayscale section S_G2, by substantially continuously changing at least one of the data signal VDATA and the duty ratio of the duty control signal CDCS or decreasing a change amount of the signals according to a grayscale change, a luminance difference may be prevented from occurring in a boundary area between the first grayscale section S_G1 and the second grayscale section S_G2, and the display quality may be further improved.

Figure 11:
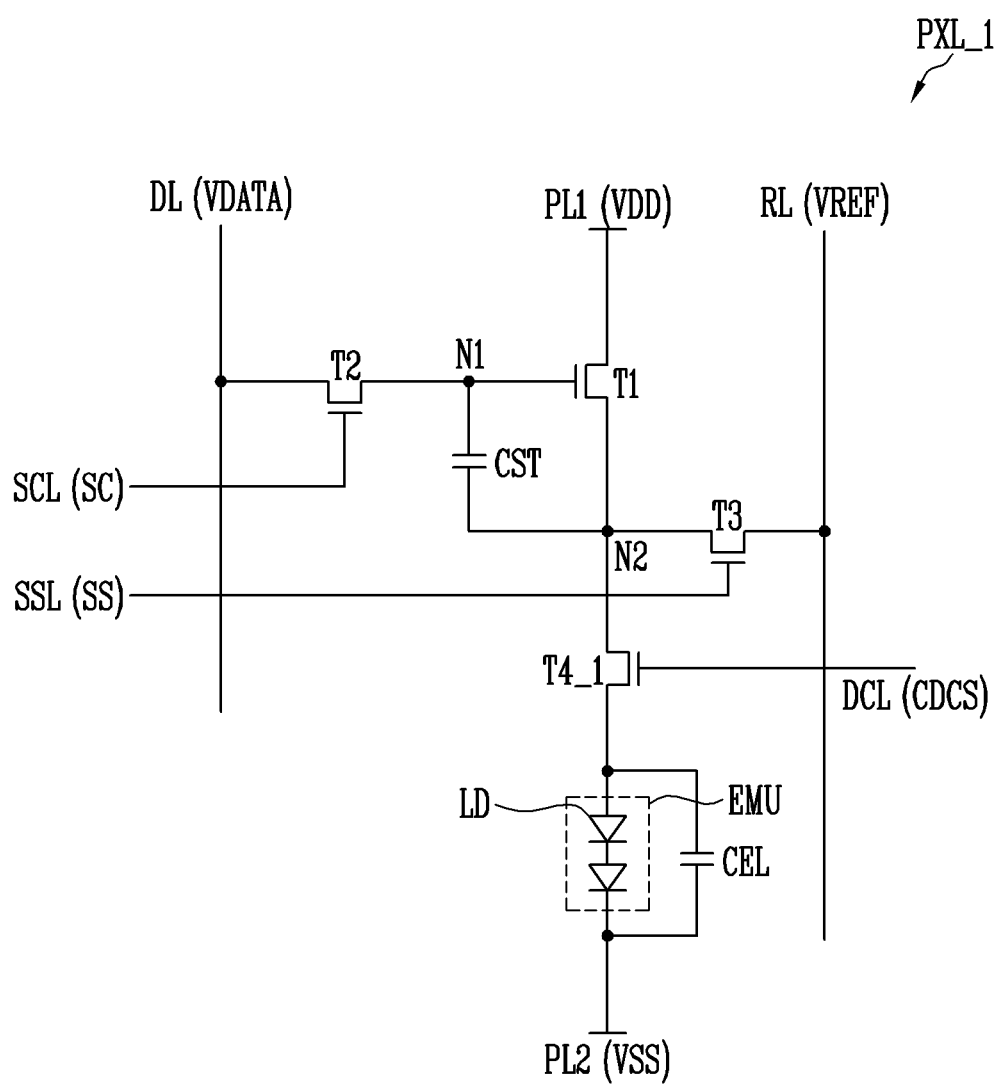
FIGS. 11 and 12 are schematic diagrams illustrating an embodiment of the pixel included in the display device of FIG. 2.
Figure 12:
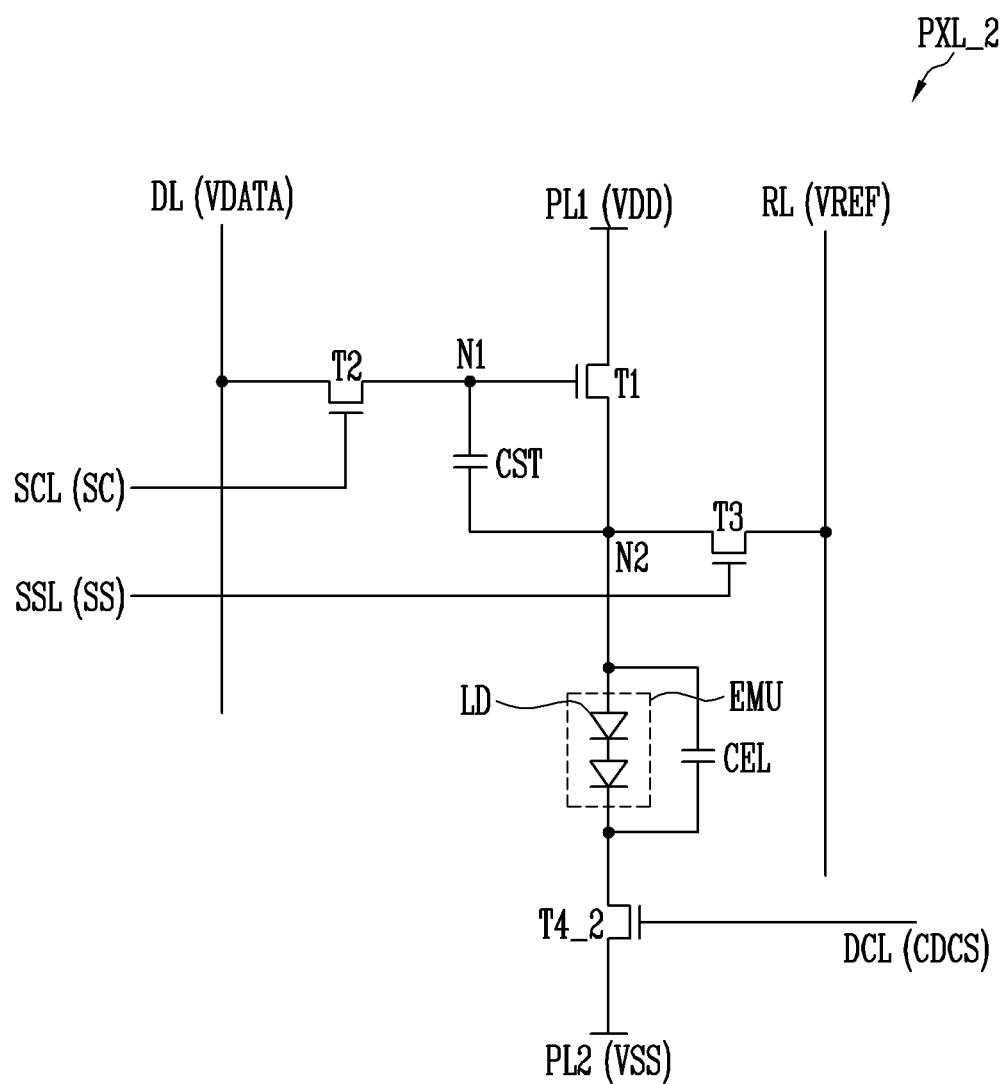

FIGS. 11 and 12 are schematic diagrams illustrating an embodiment of the pixel included in the display device of FIG. 2.

Referring to FIGS. 2, 3, 11, and 12, each of a pixel PXL_1 of FIG. 11 and a pixel PXL_2 of FIG. 12 may be substantially identical to or similar to the pixel of FIG. 3 except for fourth transistors T4_1 and T4_2. Therefore, an overlapping description may not be repeated.

In an embodiment, as shown in FIG. 11, the pixel PXL_1 may include the fourth transistor T4_1.

A first electrode of the fourth transistor T4_1 may be connected to the second node N2, and a second electrode of the fourth transistor T4_2 may be connected to the first electrode (for example, the anode electrode) of the light emitting unit EMU. A gate electrode of the fourth transistor T4_1 may be connected to the duty control line DCL. In case that the duty control signal CDCS of the turn-on voltage level is supplied to the duty control line DCL, the fourth transistor T4_1 may be turned on, and the driving current may be provided to the light emitting unit EMU through the fourth transistor T4_1. For example, in case that the fourth transistor T4_1 is turned on, the light emitting unit EMU (or the pixel PXL) may emit light. As the duty ratio (or the on-duty ratio) of the duty control signal CDCS increases, the emission time of the light emitting unit EMU may increase.

Therefore, the driver 130 (refer to FIG. 2) (or the duty controller 132, refer to FIG. 2) may output duty control signal CDCS of the turn-on voltage level in the first and second grayscale sections S_G1 and S_G2 (refer to FIG. 5A), and may vary the duty ratio of the duty control signal CDCS in the third grayscale section S_G3 (refer to FIG. 5A). For example, the on-duty ratio of the duty control signal CDCS may decrease as the grayscale decreases in the third grayscale section S_G3. However, the duty control signal CDCS is not limited thereto. For example, in case that the first transistor T1 of FIG. 3 is implemented with a P-type transistor instead of an N-type transistor, the duty control signal CDCS may be the same as the duty control signal CDCS described with reference to FIGS. 5A and 5B, and for example, the on-duty ratio of the duty control signal CDCS may increase as the grayscale decreases in the third grayscale section S_G3.

In an embodiment, as shown in FIG. 12, the pixel PXL_2 may include the fourth transistor T4_2.

A first electrode of the fourth transistor T4_2 may be connected to the second electrode (for example, the cathode electrode) of the light emitting unit EMU, and a second electrode of the fourth transistor T4_2 may be connected to the second power line PL2. A gate electrode of the fourth transistor T4_2 may be connected to the duty control line DCL. In case that the duty control signal CDCS of the turn-on voltage level is supplied to the duty control line DCL, the fourth transistor T4_2 may be turned on, and the driving current may be provided to the light emitting unit EMU through the fourth transistor T4_2. An operation and a function of the fourth transistor T4_2 of FIG. 12 may be substantially the same as an operation and a function of the fourth transistor T4_1 of FIG. 11.

As described above, the pixels PXL_1 and PXL_2 may include the fourth transistors T4_1 and T4_2 connected to the light emitting unit EMU between the second node N2 and the second power line PL2 in series instead of the fourth transistor T4 (refer to FIG. 3) connected to the light emitting unit EMU in parallel.

In relation to an operation of the pixels PXL_1 and PXL_2, not only the embodiments of FIGS. 5A and 5B but also the embodiments of FIGS. 9 and 10 may be applied.

Figure 13:
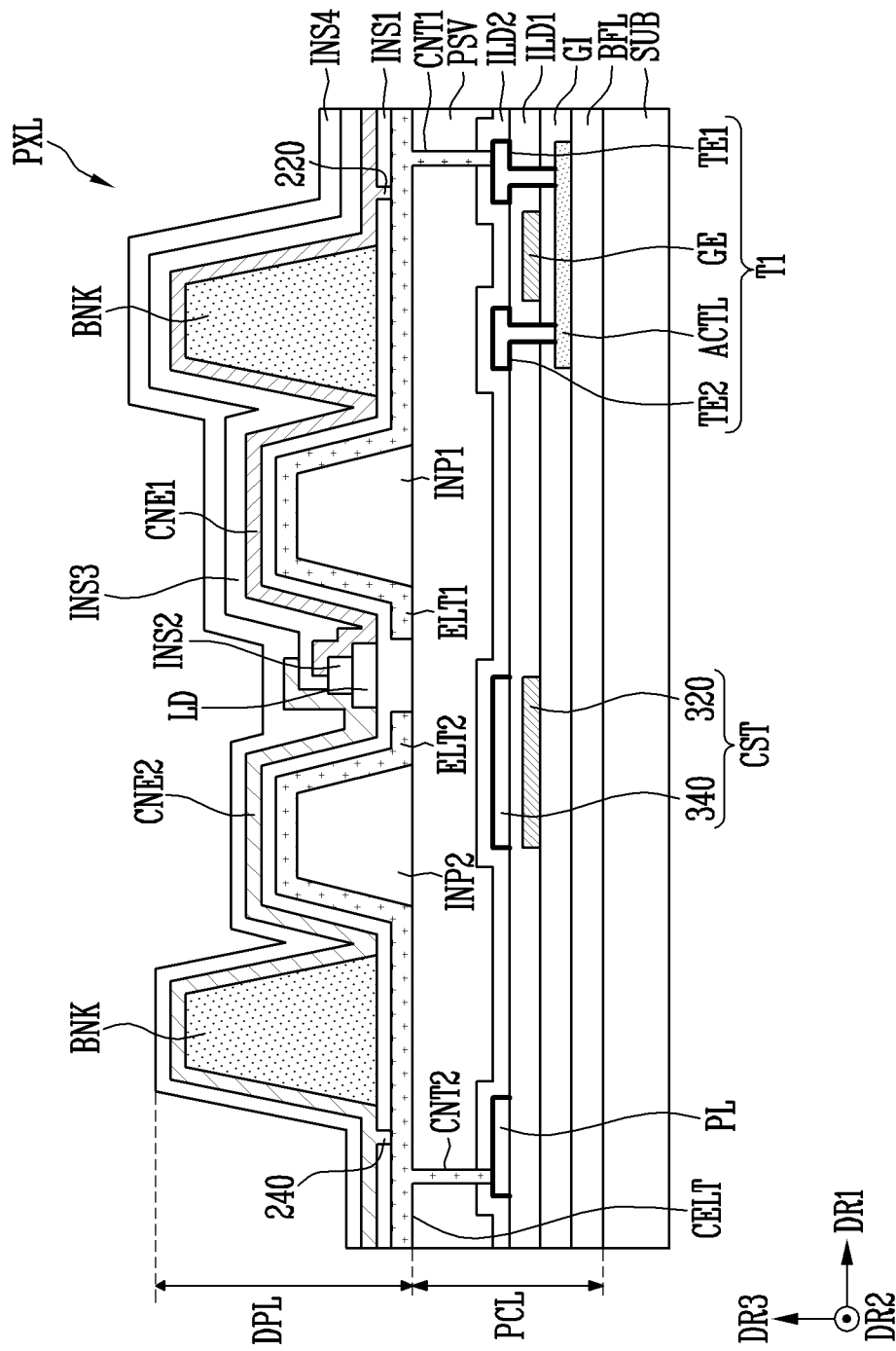
FIG. 13 is a schematic cross-sectional view illustrating an embodiment of the pixel included in the display device of FIG. 2.

FIG. 13 is a schematic cross-sectional view illustrating an embodiment of the pixel included in the display device of FIG. 2.

Referring to FIG. 13, the pixel PXL may include a substrate SUB, a pixel circuit unit PCL (or a pixel circuit layer), and a display element unit DPL (or a display element layer).

The substrate SUB may be provided as a base surface, and the pixel circuit unit PCL and the display element unit DPL may be disposed on the substrate SUB.

The pixel circuit unit PCL may be disposed on the substrate SUB. The pixel circuit unit PCL may include a buffer layer BFL, the first transistor T1, a gate insulating layer GI, a first interlayer insulating layer ILD1, a second interlayer insulating layer ILD2, the storage capacitor CST, a power line PL, a protection layer PSV, a first contact portion CNT1, and a second contact portion CNT2. The first transistor T1, the storage capacitor CST, and the power line PL may correspond to the first transistor T1, the storage capacitor CST, and the second power line PL2 described with reference to FIG. 3, respectively.

The buffer layer BFL may be disposed on the substrate SUB. The buffer layer BFL may prevent an impurity from diffusing from the outside. The buffer layer BFL may include at least one of a metal oxide such as silicon nitride ($SiN_x$), silicon oxide ($SiO_x$), silicon oxynitride ($SiO_xN_y$), or aluminum oxide ($AlO_x$).

The first transistor T1 may be a thin film transistor. According to an embodiment, the first transistor T1 may be a driving transistor.

The first transistor T1 may be electrically connected to the light emitting element LD. The first transistor T1 may be electrically connected to a first electrode ELT1 through the first contact portion CNT1.

The first transistor T1 may include an active layer ACTL, a first transistor electrode TE1, a second transistor electrode TE2, and a gate electrode layer GE.

The active layer ACTL may mean a semiconductor layer. The active layer ACTL may be disposed on the buffer layer BFL. For example, the active layer ACTL may include at least one of polysilicon, low temperature polycrystalline silicon (LTPS), amorphous silicon, and an oxide semiconductor.

The active layer ACTL may include a first contact region that is in contact with the first transistor electrode TE1 and a second contact region that is in contact with the second transistor electrode TE2. The first contact region and the second contact region may be a semiconductor pattern doped with an impurity. A region between the first contact region and the second contact region may be a channel region. The channel region may be an intrinsic semiconductor pattern that is not doped with an impurity.

The gate electrode layer GE may be disposed on the gate insulating layer GI. A position of the gate electrode layer GE may correspond to a position of the channel region of the active layer ACTL. For example, the gate electrode layer GE may be disposed on the channel region of the active layer ACTL with the gate insulating layer GI interposed therebetween.

The gate insulating layer GI may be disposed on the active layer ACTL. The gate insulating layer GI may include an inorganic material. According to an embodiment, the gate insulating layer GI, the first interlayer insulating layer ILD1, the second interlayer insulating layer ILD2, and the protection layer PSV may include at least one of silicon nitride ($SiN_x$), silicon oxide ($SiO_x$), silicon oxynitride ($SiO_xN_y$), and aluminum oxide ($AlO_x$). According to an embodiment, the gate insulating layer GI, the first interlayer insulating layer ILD1, the second interlayer insulating layer ILD2, and the protection layer PSV may include an organic material. The gate insulating layer GI, the first interlayer insulating layer ILD1, the second interlayer insulating layer ILD2, and the protection layer PSV may be formed of a single layer or multiple layers.

The first interlayer insulating layer ILD1 may be disposed on the gate electrode layer GE.

The first transistor electrode TE1 and the second transistor electrode TE2 may be disposed on the first interlayer insulating layer ILD1. The first transistor electrode TE1 may be in contact with the first contact region of the active layer ACTL by passing through the gate insulating layer GI and the first interlayer insulating layer ILD1, and the second transistor electrode TE2 may be in contact with the second contact region of the active layer ACTL by passing through the gate insulating layer GI and the first interlayer insulating layer ILD1. According to an example, the first transistor electrode TE1 may be a drain electrode, and the second transistor electrode TE2 may be a source electrode, but the disclosure is not limited thereto.

According to an embodiment, the first transistor electrode TE1 and the second transistor electrode TE2 may include a conductive material. For example, the first transistor electrode TE1 and the second transistor electrode TE2 may include a metal such as molybdenum (Mo), magnesium (Mg), silver (Ag), platinum (Pt), palladium (Pd), gold (Au), nickel (Ni), neodymium (Nd), iridium (Jr), chromium (Cr), titanium (Ti), copper (Cu), aluminum (Al), and/or an alloy thereof. According to an example, the first transistor electrode TE1 and the second transistor electrode TE2 may have a multilayer structure including titanium (Ti) and copper (Cu).

The second interlayer insulating layer ILD2 may be disposed on the first transistor electrode TE1 and the second transistor electrode TE2.

The storage capacitor CST may include a first storage plate 320 (or a first capacitor electrode) and a second storage plate 340 (or a second capacitor electrode). The first storage plate 320 and the second storage plate 340 may face each other with the first interlayer insulating layer ILD1 interposed therebetween. The first storage plate 320 may be disposed on the gate insulating layer GI, and the second storage plate 340 may be disposed on the first interlayer insulating layer ILD1.

The power line PL may be disposed on the first interlayer insulating layer ILD1. The power line PL may be electrically connected to a second electrode ELT2 through the second contact portion CNT2 and a common connection electrode CELT.

The protection layer PSV may be disposed on the second interlayer insulating layer ILD2. According to an embodiment, in the protection layer PSV, the first contact portion CNT1 connected to one area or an area of the first transistor electrode TE1 and the second contact portion CNT2 connected to one area or an area of the power line PL may be formed. Each of the first contact portion CNT1 and the second contact portion CNT2 may be provided through the protection layer PSV and the second interlayer insulating layer ILD2.

The display element unit DPL may be disposed on the pixel circuit unit PCL. The display element unit DPL may include a first insulating pattern INP1, a second insulating pattern INP2, a bank BNK, the first electrode ELT1, the second electrode ELT2, the common connection electrode CELT, the first insulating layer INS1, the light emitting element LD, the second insulating layer INS2, a first contact electrode CNE1, a third insulating layer INS3, a second contact electrode CNE2, and a fourth insulating layer INS4.

The first insulating pattern INP1 and the second insulating pattern INP2 may protrude in a thickness direction (for example, a third direction DR3) of the substrate SUB. The first insulating pattern INP1 and the second insulating pattern INP2 may be spaced apart from each other in a first direction DR1 and may extend in a second direction DR2. The first insulating pattern INP1 and the second insulating pattern INP2 may be arranged or disposed in a shape surrounding an area in which the light emitting elements LD the disposed in case that viewed in a plan view. The first insulating pattern INP1 and the second insulating pattern INP2 may include an organic material or an inorganic material.

The first electrode ELT1 may be disposed on the first insulating pattern INP1, and the second electrode ELT2 may be disposed on the second insulating pattern INP2. The first electrode ELT1 and the second electrode ELT2 may reflect light provided from the light emitting element LD in a display direction (for example, the third direction DR3) of the display device DD, and thus the light efficiency of the pixel PXL may be improved. The first electrode ELT1 and the second electrode ELT2 may include one of molybdenum (Mo), magnesium (Mg), silver (Ag), platinum (Pt), palladium (Pd), gold (Au), nickel (Ni), and neodymium (Nd), iridium (Jr), chromium (Cr), titanium (Ti), copper (Cu), and aluminum (Al). However, the disclosure is not limited to the above-described example.

The first electrode ELT1 may electrically connect the first transistor T1 and the first contact electrode CNE1. The first electrode ELT1 may be electrically connected to the first transistor T1 through the first contact portion CNT1. For example, the first electrode ELT1 may provide an anode signal to the first contact electrode CNE1.

The second electrode ELT2 may be electrically connected to the power line PL through the common connection electrode CELT.

The common connection electrode CELT may be disposed on the protection layer PSV. The common connection electrode CELT may be integral with the second electrode ELT2.

The common connection electrode CELT may provide an electrical signal (for example, a cathode signal) to the second contact electrode CNE2. The common connection electrode CELT may be electrically connected to the power line PL through the second contact portion CNT2. The common connection electrode CELT may electrically connect the power line PL and the second electrode ELT2.

The first insulating layer INS1 may be disposed on the protection layer PSV. The first insulating layer INS1 may cover or overlap the first electrode ELT1 and the second electrode ELT2. The first insulating layer INS1 may stabilize a connection between electrode components and reduce an external influence. The first insulating layer INS1 may include any one of silicon nitride ($SiN_x$), silicon oxide ($SiO_x$), silicon oxynitride ($SiO_xN_y$), and aluminum oxide ($AlO_x$).

The bank BNK may be disposed on the first insulating layer INS1. The bank BNK may protrude in the thickness direction of the substrate SUB. An area in which the light emitting element LD may be disposed may be provided between the banks BNK. The bank BNK may include an organic material or an inorganic material, but is not limited to a given example.

The light emitting element LD may be disposed on the first insulating layer INS1. The light emitting element LD may emit light based on an electrical signal provided from the first contact electrode CNE1 and the second contact electrode CNE2.

According to an embodiment, the light emitting element LD may be disposed based on an electric field formed by an electrical signal provided to the first electrode ELT1 and the second electrode ELT2. For example, a first electrical signal may be provided to the first electrode ELT1, a second electrical signal may be provided to the second electrode ELT2, the first electrical signal and the second electrical signal may form the electric field between the first electrode ELT1 and the second electrode ELT2, and the light emitting element LD may be arranged or disposed by external force (for example, dielectrophoretic (DEP) force) according to the electric field.

The second insulating layer INS2 may be disposed on the light emitting element LD. The second insulating layer INS2 may cover or overlap the active layer ACT (refer to FIG. 1B) of the light emitting element LD. According to an example, the second insulating layer INS2 may include at least one of an organic material and an inorganic material.

The first contact electrode CNE1 and the second contact electrode CNE2 may be disposed on the first insulating layer INS1. The first contact electrode CNE1 may be electrically connected to the first electrode ELT1 through a first contact member 220. The first contact electrode CNE1 may electrically connect the light emitting element LD and the first electrode ELT1. The second contact electrode CNE2 may be electrically connected to the common connection electrode CELT through the second contact member 240. The second contact electrode CNE2 may electrically connect the light emitting element LD and the common connection electrode CELT.

The first contact electrode CNE1 and the second contact electrode CNE2 may include a conductive material. According to an example, the first contact electrode CNE1 and the second contact electrode CNE2 may include a transparent conductive material including indium tin oxide (ITO), indium zinc oxide (IZO), and indium tin zinc oxide (ITZO), but is not limited thereto.

The third insulating layer INS3 may be disposed on the first contact electrode CNE1. At least a portion of the third insulating layer INS3 may be disposed between the first contact electrode CNE1 and the second contact electrode CNE2 to prevent a short between the first contact electrode CNE1 and the second contact electrode CNE2. According to an embodiment, the third insulating layer INS3 may include at least one of silicon nitride ($SiN_x$), silicon oxide ($SiO_x$), silicon oxynitride ($SiO_xN_y$), and aluminum oxide ($AlO_x$).

The fourth insulating layer INS4 may be disposed outside the display element unit DPL. The fourth insulating layer INS4 may protect an individual configuration of the display element unit DPL from an external influence. According to an embodiment, the fourth insulating layer INS4 may include at least one of silicon nitride ($SiN_x$), silicon oxide ($SiO_x$), silicon oxynitride ($SiO_xN_y$), and aluminum oxide ($AlO_x$).

A structure of the pixel PXL is not limited to the above-described example. According to an embodiment, the pixel PXL may further include an additional configuration.

For example, a planarization layer may be further provided on the fourth insulating layer INS4. The planarization layer may relieve a step difference generated by various configurations disposed thereunder, and an upper surface of the planarization layer may be generally flat. According to an embodiment, the planarization layer may include an organic insulating layer.

Figure 14:
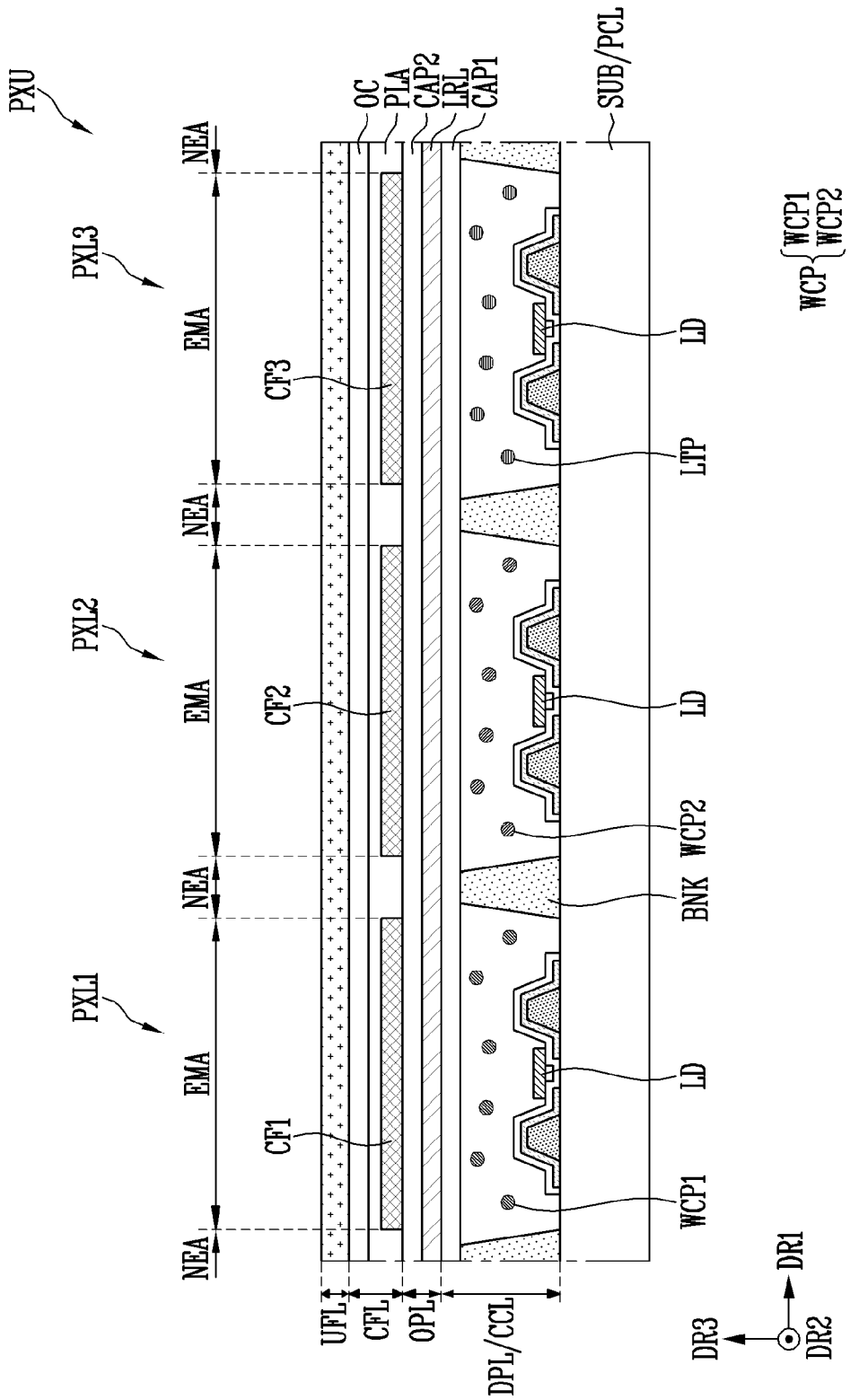
FIGS. 14 and 15 are schematic diagrams illustrating an embodiment of the pixel included in the display device of FIG. 2.
Figure 15:
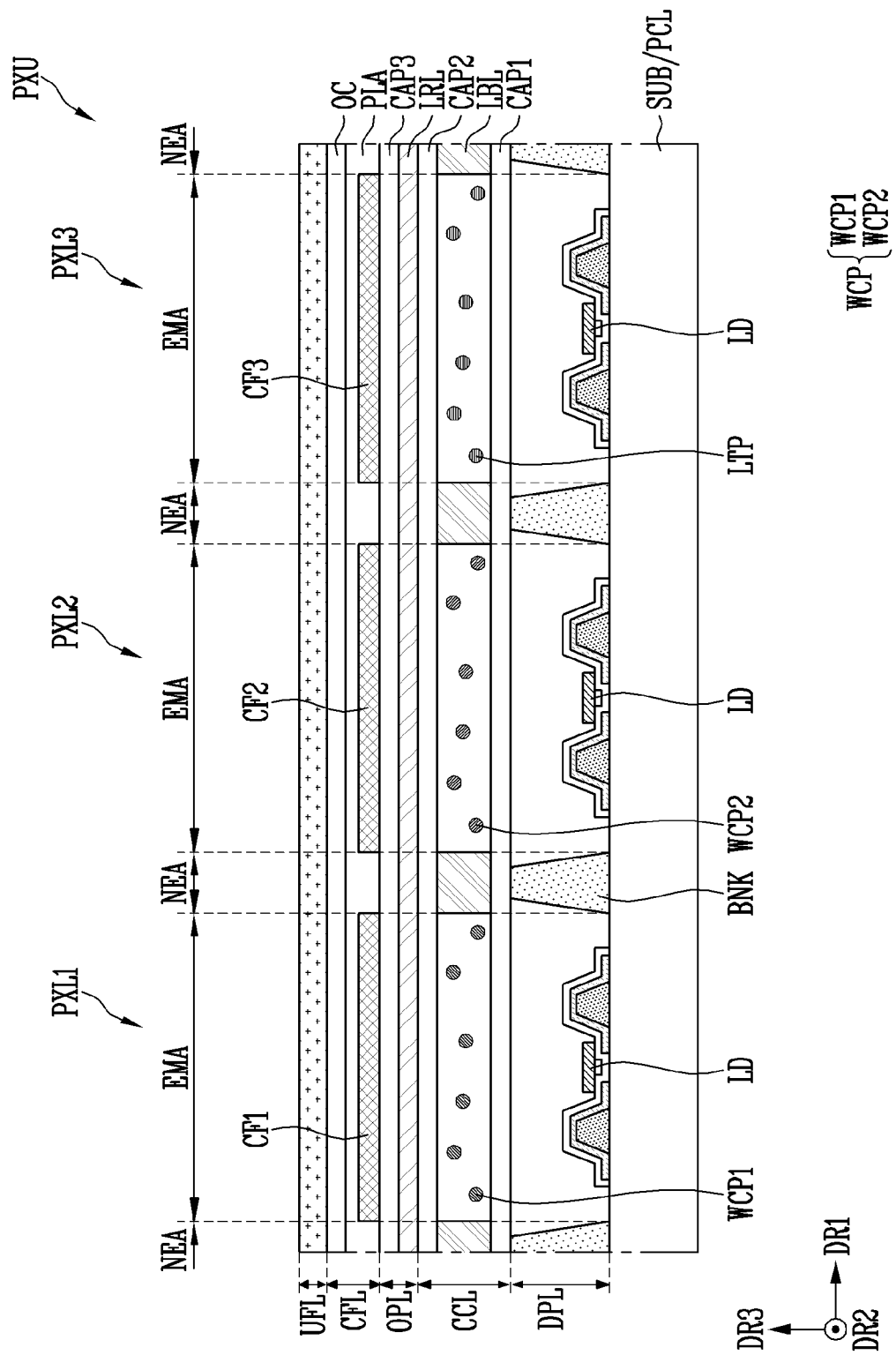

FIGS. 14 and 15 are schematic diagrams illustrating an embodiment of the pixel included in the display device of FIG. 2. For convenience of description, individual configurations of the pixel circuit layer PCL and the display element layer DPL are simplified in FIGS. 14 and 15.

First, referring to FIGS. 13 and 14, a first pixel PXL1, a second pixel PXL2, and a third pixel PXL3 may form a pixel unit PXU. The pixel unit PXU may be a unit displaying various colors. The light emitting elements LD disposed in each of the first pixel PXL1, the second pixel PXL2, and the third pixel PXL3 may emit light of a same color. For example, the first pixel PXL1, the second pixel PXL2, and the third pixel PXL3 may include light emitting elements LD that emit a third color, for example, blue light. A color conversion unit CCL and/or a color filter unit CFL may be provided to the first pixel PXL1, the second pixel PXL2, and the third pixel PXL3 to display a full-color image. However, the disclosure is not limited thereto, and the first pixel PXL1, the second pixel PXL2, and the third pixel PXL3 may include light emitting elements LD that emit light of different colors.

The color conversion unit CCL may be disposed on a same layer as the display element layer DPL. For example, the color conversion unit CCL may be disposed between the banks BNK.

The color conversion unit CCL may include a wavelength conversion pattern WCP (or a color conversion particle), a light transmission pattern LTP, and a first capping layer CAP1. According to an example, the wavelength conversion pattern WCP may include a first wavelength conversion pattern WCP1 and a second wavelength conversion pattern WCP2.

The first wavelength conversion pattern WCP1 may be disposed to overlap an emission area EMA of the first pixel PXL1. For example, the first wavelength conversion pattern WCP1 may be provided between the banks BNK and may overlap the emission area EMA of the first pixel PXL1 in case that viewed in a plan view.

The second wavelength conversion pattern WCP2 may be disposed to overlap the emission area EMA of the second pixel PXL2. For example, the second wavelength conversion pattern WCP2 may be provided between the banks BNK and may overlap the emission area EMA of the second pixel PXL2 in case that viewed in a plan view.

The light transmission pattern LTP may be disposed to overlap the emission area EMA of the third pixel PXL3. For example, the light transmission pattern LTP may be provided between the banks BNK and may overlap the emission area EMA of the third pixel PXL3 in case that viewed in a plan view.

In an embodiment, the first wavelength conversion pattern WCP1 may include first color conversion particles that convert the light of the third color emitted from the light emitting element LD into light of a first color. For example, in case that the light emitting element LD is a blue light emitting element emitting blue light and the first pixel PXL1 is a red pixel, the first wavelength conversion pattern WCP1 may include a first quantum dot that converts the blue light emitted from the blue light emitting element into red light.

For example, the first wavelength conversion pattern WCP1 may include first quantum dots dispersed in a matrix material such as a base resin. The first quantum dot may absorb the blue light and shift a wavelength according to an energy transition to emit the red light. In case that the first pixel PXL1 is a pixel of another color, the first wavelength conversion pattern WCP1 may include a first quantum dot corresponding to a color of the first pixel PXL1.

In an embodiment, the second wavelength conversion pattern WCP2 may include second color conversion particles that convert the light of the third color emitted from the light emitting element LD into light of a second color. For example, in case that the light emitting element LD is the blue light emitting element emitting the blue light and the second pixel PXL2 is a green pixel, the second wavelength conversion pattern WCP2 may include a second quantum dot that converts the blue light emitted from the blue light emitting element into green light.

For example, the second wavelength conversion pattern WCP2 may include second quantum dots dispersed in a matrix material such as a base resin. The second quantum dot may absorb the blue light and shift a wavelength according to an energy transition to emit the green light. In case that the second pixel PXL2 is a pixel of another color, the second wavelength conversion pattern WCP2 may include a second quantum dot corresponding to a color of the second pixel PXL2.

The first quantum dot and the second quantum dot may have a spherical shape, a pyramidal shape, a multi-arm shape, or a shape of a cubic nano particle, nano tube, nano wire, nano fiber, nano plate particle, or the like, but is not limited thereto, and a shape of the first quantum dot and the second quantum dot may be variously changed.

In an embodiment, an absorption coefficient of the first quantum dot and the second quantum dot may be increased by causing the blue light having a relatively short wavelength in a visible light region to be incident on the first quantum dot and the second quantum dot. Accordingly, finally efficiency of light emitted from the first pixel PXL1 and the second pixel PXL2 may be increased, and excellent color reproducibility may be secured. By configuring the pixel unit of the first to third pixels PXL1, PXL2, and PXL3 using the light emitting elements LD (for example, the blue light emitting elements) of a same color, manufacturing efficiency of the display device may be increased.

In an embodiment, the light transmission pattern LTP may be provided to efficiently use the light of the third color emitted from the light emitting element LD. For example, in case that the light emitting element LD is the blue light emitting element emitting the blue light and the third pixel PXL3 is a blue pixel, the light transmission pattern LTP may include at least one type of light scattering particles to efficiently use the light emitted from the light emitting element LD.

For example, the light transmission pattern LTP may include light scattering particles dispersed in a matrix material such as a base resin. For example, the light transmission pattern LTP may include light scattering particles such as silica, but a configuration material of the light scattering particles is not limited thereto.

The light scattering particles may not disposed in the emission area EMA related to the third pixel PXL3. For example, the light scattering particles may be selectively included in the first wavelength conversion pattern WCP1 and/or the second wavelength conversion pattern WCP2.

The first capping layer CAP1 may seal (or cover) or overlap the wavelength conversion pattern WCP and the light transmission pattern LTP. The first capping layer CAP1 may be disposed between a low refraction layer LRL and the display element layer DPL. The first capping layer CAP1 may be provided over the first to third pixels PXL1, PXL2, and PXL3. The first capping layer CAP1 may prevent an impurity such as moisture or air from penetrating from the outside and damaging or contaminating the color conversion unit CCL.

In an embodiment, the first capping layer CAP1 may be a single layer or multiple layers by including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but is not necessarily limited thereto.

The optical layer OPL may include the low refraction layer LRL and a second capping layer CAP2. The optical layer OPL may be disposed on the color conversion unit CCL. The optical layer OPL may be disposed on the display element layer DPL.

The low refraction layer LRL may be disposed between the first capping layer CAP1 and the second capping layer CAP2. The low refraction layer LRL may be disposed between the color conversion unit CCL and the color filter unit CFL. The low refraction layer LRL may be provided over the first to third pixels PXL1, PXL2, and PXL3.

The low refraction layer LRL may perform a role of improving light efficiency by recycling light provided from the color conversion unit CCL by total reflection. To this end, the low refraction layer LRL may have a relatively lower refractive index than that of the color conversion unit CCL.

In an embodiment, the low refraction layer LRL may include a base resin and a hollow particle dispersed in the base resin. The hollow particle may include a hollow silica particle. By way of example, the hollow particle may be a pore formed by porogen, but is not necessarily limited thereto. The low refraction layer LRL may include at least one of a zinc oxide (ZnO) particle, a titanium dioxide ($TiO_2$) particle, and a nano silicate particle, but is not necessarily limited thereto.

The second capping layer CAP2 may be disposed on the low refraction layer LRL. The second capping layer CAP2 may be disposed between the color filter unit CFL and the low refraction layer LRL. The second capping layer CAP2 may be provided over the first to third pixels PXL1, PXL2, and PXL3. The second capping layer CAP2 may prevent an impurity such as moisture or air from penetrating from the outside and damaging or contaminating the low refraction layer LRL.

In an embodiment, the second capping layer CAP2 may be a single layer or multiple layers by including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but is not necessarily limited thereto.

The color filter unit CFL may be disposed on the second capping layer CAP2. The color filter unit CFL may be provided over the first to third pixels PXL1, PXL2, and PXL3. The color filter unit CFL may include color filters CF1, CF2, and CF3, a planarization layer PLA, and an overcoat layer OC.

In an embodiment, the color filters CF1, CF2, and CF3 may be disposed on the second capping layer CAP2. The color filters CF1, CF2, and CF3 may overlap the emission area EMA of the first to third pixels PXL1, PXL2, and PXL3 in case that viewed in a plan view.

In an embodiment, the first color filter CF1 may transmit light of a first color, and may not transmit light of a second color and light of a third color. For example, the first color filter CF1 may include a colorant related to the first color.

In an embodiment, the second color filter CF2 may transmit the light of the second color, and may not transmit the light of the first color and the light of the third color. For example, the second color filter CF2 may include a colorant related to the second color.

In an embodiment, the third color filter CF3 may transmit the light of the third color, and may not transmit the light of the first color and the light of the second color. For example, the third color filter CF3 may include a colorant related to the third color.

In an embodiment, the planarization layer PLA may be disposed on the color filters CF1, CF2, and CF3. The planarization layer PLA may cover or overlap the color filters CF1, CF2, and CF3. The planarization layer PLA may cancel a step difference generated by the color filters CF1, CF2, and CF3. The planarization layer PLA may be provided over the first to third pixels PXL1, PXL2, and PXL3.

According to an example, the planarization layer PLA may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not necessarily limited thereto, and the planarization layer PLA may include various types of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The overcoat layer OC may be disposed on the planarization layer PLA. The overcoat layer OC may be disposed between an upper film layer UFL and the color filter unit CFL. The overcoat layer OC may be provided over the first to third pixels PXL1, PXL2, and PXL3. The overcoat layer OC may cover or overlap a lower member including the color filter unit CFL. The overcoat layer OC may prevent moisture or air from penetrating into the above-described lower member. The overcoat layer OC may protect the above-described lower member from a foreign substance such as dust.

In an embodiment, the overcoat layer OC may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not necessarily limited thereto, and the overcoat layer OC may include various types of inorganic materials such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$).

The upper film layer UFL may be disposed on the color filter unit CFL. The upper film layer UFL may be disposed outside the display device DD to reduce an external influence on the display device DD. The upper film layer UFL may be provided over the first to third pixels PXL1, PXL2, and PXL3.

In an embodiment, the upper film layer UFL may include an anti-reflective (AR) coating layer. The AR coating layer may refer to a configuration in which a material having an antireflection function is applied to one surface or a surface of a specific or given configuration. Here, the applied material may have a low reflectance. According to an example, the material used for the AR coating layer may include any one of $SiO_x$, $ZiO_x$, $Al_xO_y$, and $TiO_x$. However, the disclosure is not limited thereto, and various other materials may be applied.

In FIG. 14, the color conversion unit CCL is disposed on a same layer as the display element layer DPL, but the disclosure is not limited thereto.

Referring to FIG. 15, the color converter CCL may be disposed on the display element layer DPL. For example, the first capping layer CAP1 may seal (or cover) or overlap an area in which the light emitting elements LD are disposed, and the color conversion unit CCL may be disposed on the first capping layer CAP1.

In an embodiment, the color conversion unit CCL may further include a light blocking layer LBL. The light blocking layer LBL may be disposed on the display element layer DPL. The light blocking layer LBL may be disposed between the first capping layer CAP1 and the second capping layer CAP2. The light blocking layer LBL may be disposed to surround the first wavelength conversion pattern WCP1, the second wavelength conversion pattern WCP2, and the light transmission pattern LTP at a boundary between the first to third pixels PXL1, PXL2, and PXL3.

The light blocking layer LBL may define the emission area EMA and a non-emission area NEA of the pixel PXL. For example, the light blocking layer LBL may not overlap the light emitting area EMA in case that viewed in a plan view. The light blocking layer LBL may overlap the non-emission area NEA in case that viewed in a plan view. According to an example, an area in which the light blocking layer LBL is not disposed may be defined as the emission area EMA of the first to third pixels PXL1, PXL2, and PXL3.

In an embodiment, the light blocking layer LBL may be formed of an organic material including at least one of graphite, carbon black, black pigment, or black dye, or may be formed of a metal material including chrome (Cr), but is not limited as long as the light blocking layer LBL is a material capable of blocking and absorbing light.

The second capping layer CAP2 may seal (or cover) or overlap the first wavelength conversion pattern WCP1, the second wavelength conversion pattern WCP2, and the light transmission pattern LTP.

The low refraction layer LRL may be disposed between the second capping layer CAP2 and a third capping layer CAP3. Similar to the first capping layer CAP1 and the second capping layer CAP2, the third capping layer CAP3 may be a single layer or multiple layers by including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but is not limited thereto.

Although the disclosure has been described in detail in accordance with the above-described embodiments, it should be noted that the above-described embodiments are for the purpose of description and not of limitation. Those skilled in the art will understand that various modifications are possible within the scope of the disclosure.

The scope of the disclosure is not limited to the details described in the detailed description of the specification, but should also be defined by the claims. It is to be understood that all changes or modifications derived from the meaning and scope of the claims and equivalent concepts thereof are included in the scope of the disclosure.

What is claimed is:

1. A display device comprising:
a display panel including a pixel including a light emitting unit including at least one light emitting element; a driving transistor providing a driving current corresponding to a data signal to the light emitting unit; and a first transistor electrically connected between both ends of the light emitting unit; and
a driver that provides the data signal to the pixel and provides a duty control signal to the first transistor,
wherein the driver varies a voltage level of the data signal in a first grayscale section in which a grayscale corresponding to the data signal is greater than or equal to a reference grayscale, and varies a duty ratio of the duty control signal in a second grayscale section in which the grayscale is less than the reference grayscale.

2. The display device according to claim 1, wherein an on-duty ratio of the duty control signal increases as the grayscale decreases in the second grayscale section.

3. The display device according to claim 2, wherein the voltage level of the data signal is constant in the second grayscale section.

4. The display device according to claim 3, wherein the at least one light emitting element is an inorganic light emitting diode.

5. The display device according to claim 4, wherein
a light efficiency of the light emitting unit decreases as the driving current of the driving transistor decreases, and
the data signal has a voltage level at which the light efficiency becomes maximum in the second grayscale section.

6. The display device according to claim 3, wherein the voltage level of the data signal is substantially discontinuous at a boundary between the first grayscale section and the second grayscale section.

7. The display device according to claim 1, wherein the driver comprises:
a control block that outputs a first signal having a voltage level corresponding to the grayscale; and
a comparator that outputs the duty control signal by comparing a second signal with the first signal, and
the duty control signal is provided to a gate electrode of the first transistor.

8. The display device according to claim 7, wherein
the second signal is a sawtooth wave, a triangle wave, or a sine wave, and
the duty control signal has a turn-on voltage level in case that the second signal is greater than the first signal.

9. The display device according to claim 8, wherein
the first transistor is an N-type transistor, and
a voltage level of the control signal decreases as the grayscale decreases.

10. The display device according to claim 7, wherein
the pixel includes a sensing transistor electrically connected to a source electrode of the driving transistor, and
the driver receives a sensing signal from the pixel through the sensing transistor.

11. The display device according to claim 10, wherein the driver corrects a voltage level of the first signal based on the sensing signal.

12. The display device according to claim 1, wherein the driver varies the duty ratio of the duty control signal by a pulse frequency modulation.

13. The display device according to claim 1, wherein the driver varies each of the voltage level of the data signal and the duty ratio of the duty control signal in a third grayscale section between the first grayscale section and the second grayscale section.

14. The display device according to claim 13, wherein the voltage level of the data signal is substantially continuous at a boundary between the first grayscale section and the third grayscale section.

15. The display device according to claim 13, wherein
a first voltage range of the data signal for the first grayscale section and a second voltage range of the data signal for the third grayscale section do not overlap each other in a plan view, and
the data signal has a voltage level at a boundary between the first voltage range and the second voltage range in the second grayscale section.

16. A display device comprising:
a driver that generates a duty control signal and a data signal; and
a display panel including a pixel emitting light of a luminance corresponding to a duty of the duty control signal and the data signal, wherein
grayscales corresponding to the data signal are sequentially divided into a first grayscale section, a second grayscale section, and a third grayscale section,
the driver varies a voltage level of the data signal in the first grayscale section and the second grayscale section and varies the duty of the duty control signal in the third grayscale section, and
the voltage level of the data signal in the third grayscale section is different from the voltage level of the data signal in the second grayscale section, and is included in a voltage range of the data signal in the first grayscale section.

17. The display device according to claim 16, wherein the voltage level of the data signal is constant in the third grayscale section.

18. The display device according to claim 17, wherein
the pixel includes an inorganic light emitting diode, and
the data signal has a voltage level at which a light efficiency of the pixel becomes maximum in the third grayscale section.

19. A display device comprising:
a display panel including a pixel emitting light with a luminance corresponding to a duty of a duty control signal and a data signal; and
a driver that generates the duty control signal and the data signal and receives a sensing signal from the pixel, wherein
the driver varies a voltage level of the data signal in a first grayscale section in which a grayscale corresponding to the data signal is greater than or equal to a reference grayscale, and varies a duty ratio of the duty control signal in a second grayscale section in which the grayscale is less than the reference grayscale, and the driver corrects the duty ratio of the duty control signal based on the sensing signal.

20. The display device according to claim 19, wherein the driver comprises:
- a control block that outputs a first signal having a voltage level corresponding to the grayscale; and
- a comparator that outputs the duty control signal by comparing a second signal with the first signal, and the driver corrects a voltage level of the first signal based on the sensing signal.

\* \* \* \* \*